United States Patent [19]
Gruen et al.

[11] Patent Number: 5,849,079
[45] Date of Patent: Dec. 15, 1998

[54] DIAMOND FILM GROWTH ARGON-CARBON PLASMAS

[75] Inventors: Dieter M. Gruen, Downers Grove; Alan R. Krauss, Naperville, both of Ill.; Shengzhong Liu, Canton, Mich.; Xianzheng Pan, Wuhan Hubei, China; Christopher D. Zuiker, LaGrange, Ill.

[73] Assignee: The University of Chicago, Chicago, Ill.

[21] Appl. No.: 417,154

[22] Filed: Apr. 4, 1995

Related U.S. Application Data

[63] Continuation-in-part of Ser. No. 143,866, Oct. 27, 1993, Pat. No. 5,620,512, which is a continuation-in-part of Ser. No. 35,419, Mar. 23, 1993, Pat. No. 5,370,855, which is a continuation-in-part of Ser. No. 797,590, Nov. 25, 1991, Pat. No. 5,209,916.

[51] Int. Cl.$^6$ .................................................. C30B 29/04
[52] U.S. Cl. ...................... 117/104; 417/108; 417/929; 427/577; 427/575; 423/446
[58] Field of Search ................................... 117/108, 104, 117/929; 427/577, 575; 423/446

[56] References Cited

U.S. PATENT DOCUMENTS

| | | |
|---|---|---|
| 4,414,176 | 11/1983 | Krauss et al. |
| 4,559,901 | 12/1985 | Morimoto et al. |
| 4,634,600 | 1/1987 | Shimizu et al. |
| 4,698,198 | 10/1987 | Gruen . |
| 4,816,286 | 3/1989 | Hirose . |
| 5,015,494 | 5/1991 | Yamazaki . |
| 5,132,105 | 7/1992 | Remo . |
| 5,209,916 | 5/1993 | Gruen . |
| 5,273,788 | 12/1993 | Yu . |
| 5,328,676 | 7/1994 | Gruen . |
| 5,360,477 | 11/1994 | Inoue et al. |
| 5,370,855 | 12/1994 | Gruen . |
| 5,449,531 | 9/1995 | Zhu et al. ............................ 117/929 |
| 5,462,776 | 10/1995 | Gruen . |
| 5,529,815 | 6/1996 | Lemelson ............................ 427/475 |

OTHER PUBLICATIONS

Frenklach, Michael, et al., "Growth Mechanism of Vapor–Deposited Diamond," *J. Mater. Res.*, vol. 3, No. 1 (Jan./Feb. 1988), pp. 133–139.

Meijer, Gerard, et al., "Laser Deposition of Carbon Clusters on Surfaces: A New Approach to the Study of Fullerenes," *J. Chem. Phsy.*, vol. 93, No. 11 (Dec. 1990), pp. 7800–7802.

Angus, John C., et al., "Metastable Growth of Diamond and Diamond–Like Phases," *Annu. Rev. Mater. Sci.*, vol. 95, No. 21 (Oct. 17, 1991), pp. 221–248.

Beck, Rainer D., "Resilience of All–Carbon Molecules $C_{60}$, $C_{70}$, and $C_{84}$: A Surface–Scattering Time–of–Flight Investigation," *J. Phys. Chem.*, vol. 95 (1991), pp. 8402–8409.

Lykke, Keith R., et al., "Spectrometric Characterization of Purified $C_{60}$ and $C_{70}$," *Mat. Res. Soc. Symp. Proc.*, vol. 206 (1991), pp. 679–686.

Kroto, H. W., et al., "$C_{60}$ Buckminsterfullerene," *Chem. Rev.*, vol. 91 (1991), pp. 1213–1235.

Wang, H. H., et al., "Superconductivity at 28.6 K in a Rubidium–$C_{60}$ Fullerene Compound, $Rb_xC_{60}$, Synthesized by a Solution–Phase Technique," Reprint from *Inorganic Chemistry*, vol. 30 (1991), pp. 2962–2963.

Wang, H. H., et al., "First Easily Reproduced Solution–Phase Synthesis and Confirmation of Superconductivity in the Fullerene $K_xC_{60}$ ($T_c$=18.0±0.1 K)," Reprint from *Inorganic Chemistry*, vol. 30 (1991), pp. 2838–2839.

(List continued on next page.)

*Primary Examiner*—Robert Kunemund
*Attorney, Agent, or Firm*—Emrich & Dithmar

[57] ABSTRACT

A method and system for manufacturing diamond film. The method involves forming a carbonaceous vapor, providing a gas stream of argon, hydrogen and hydrocarbon and combining the gas with the carbonaceous vapor, passing the combined carbonaceous vapor and gas carrier stream into a chamber, forming a plasma in the chamber causing fragmentation of the carbonaceous and deposition of a diamond film on a substrate.

11 Claims, 28 Drawing Sheets

OTHER PUBLICATIONS

Edelson, Edward, "Buckyball, The Magic Molecule," *Popular Science* (Aug. 1991), pp. 52–87.

Curl, Robert F., et al., "Fullerenes," *Scientific American*, Oct. 1991, pp. 54–63.

Wurz, Peter, et al., "Delayed Electron Emission from Photoexcited $C_{60}$," *J. Chem. Phys.*, vol. 95, No. 9 (Nov. 1991), pp. 7008–7010.

Busmann, H.G., et al., "Near Specular Reflection of $C_{60}$Ions in Collisions with an HOPG Graphite Surface," *Chemical Physics Letters*, vol. 187, No. 5 (Dec. 20, 1991), pp. 459–465.

Meilunas, R., et al., "Nucleation of Diamond Films on Surfaces Using Carbon Clusters," *Appl. Phys. Lett.*, vol. 59, No. 26 (Dec. 23, 1991), pp. 3461–3463.

Regueiro, Manual Néñez, et al., "Crushing $C_{60}$ to Diamond at Room Temperature," *Nature*, vol. 355 (Jan. 16, 1992), pp. 237–239.

Geis, Michael W., et al., "Diamond Film Semiconductors," *Scientific American*, vol. 267, No. 4 (Oct. 1992), pp. 84–89.

Krätschmer, W., "Solid $C_{60}$: A New Form of Carbon," *Nature*, vol. 347 (Sep. 27, 1990), pp. 354–358.

Wasielewski, M.R., et al. "Triplet States of Fullerenes $C_{60}$ and $C_{70}$: Electron Paramagnetic Resonance Spectra, Photophysics, and Electronic Structures," *J. Am. Chem. Soc.*, vol. 113 (1991), pp. 2774–2776.

Van, Jon; "Exotic Form Opens New Carbon Uses," *Chicago Tribune*, Nov. 3, 1991.

Moffat, Anne Simon, "When Diamonds Met Buckyballs," *Science*, vol. 254, Nov. 8, 1991, p. 800.

Meilunas et al., "Activated $C_{70}$ and Diamond," Nature, 354, Nov. 28, 1991, p. 271.

Parker, D. H., et al., "High Yield Synthesis, Separation, and Mass–Spectrometric Characterization of Fullerenes $C_{60}$ to $C_{266}$", *J. Am. Chem. Sco.*, vol. 113, No. 20 (1991), pp. 7499–7503.

Windischmann, Henry, et al., "Free–standing Diamond Membranes: Optical, Morphological and Mechanical Properties," *Diamond and Related Materials*, vol. 1 (1992), pp. 656–664.

Koizumi, Satoshi, et al., "Fabrication of a Diamond Field Emitter Array," *Appl. Phys. Lett.*, vol. 64 (1994), pp. 2742–___.

DIAMOND (100) (2X1):H   FIG. 20

C2 DIMER INSERTION: STEP 1

FIG. 22 — C2 DIMER INSERTION STEP 2

FIG. 23 SECOND C2 DIMER INSERTED

FIG. 24 — C2 TROUGH INSERTION: STEP 1

C2 TROUGH INSERTION: STEP 2

5,849,079

DIAMOND FILM GROWTH ARGON-CARBON PLASMAS

This application is a continuation-in-part of Ser. No. 143,866 filed Oct. 27, 1993, U.S. Pat. No. 5,620,512, which is a continuation-in-part of Ser. No. 35,419, filed Mar. 23, 1993, U.S. Pat. No. 5,370,855, which is a continuation-in-part of Ser. No. 797,590 filed Nov. 25, 1991, U.S. Pat. No. 5,209,916.

The United States Government has rights in this invention pursuant to Contract W-31-109-ENG-38 between the U.S. Department of Energy and the University of Chicago.

The present invention is directed generally to a system and method for manufacturing diamond films from carbon precursors in an argon and hydrogen gas atmosphere. More particularly, the invention is concerned with a system and method for making diamond films by microwave dissociation of a gaseous carbonaceous compound using an excited plasma which contains the carbonaceous compound and a noble gas, a combination of noble gases or a noble gas/hydrogen gas mixture. The carbonaceous compound can comprise at least one of fullerene, methane or acetylene.

Diamond films exhibit a combination of outstanding properties including exceptional hardness, thermal conductivity, electrical resistance, chemical inertness, optical transmittance, electrical carrier mobility and dielectric breakdown strength. These outstanding physical and chemical properties have led to widespread efforts to develop improved methods of manufacturing diamond films. Prior art methods have been directed to chemical vapor deposition using a hydrogen gas atmosphere. The hydrogen gas is dissociated into atomic hydrogen in the reaction vessel, and the atomic hydrogen is then reacted with various carbon containing compounds to form condensable carbon radicals, including elemental carbon which is deposited to form the diamond layers. Typically, diamond films are grown using about one mole percent of a hydrocarbon precursor (such as methane) in a hydrogen gas atmosphere. It is conventionally accepted that a large excess of hydrogen gas is essential for the diamond thin film growth process.

In such conventional methods of manufacture, hydrogen in varying amounts is invariably incorporated into the growing diamond film which gives rise to a variety of structural, electronic and chemical defects relative to pure diamond film. Although it is known that diamond film manufactured using hydrogen introduces such defects, experimental results and theoretical works on growth mechanisms conclude that substantial hydrogen must be present during diamond film growth processes. For example, it has been shown that diamond film can be obtained using CO and $CO_2$ gas after exposing the initially produced deposits periodically to hydrogen in order to remove nondiamond carbon deposits. Methods of manufacture using methane-argon or methane-helium atmospheres have also been employed, but resulted only in formation of graphite or diamond-like carbon films, not diamond. Other researchers used methane-helium mixtures, but obtained growth of diamond films only when a methane-helium discharge atmosphere was alternated with a hydrogen-oxygen-helium discharge atmosphere. Further research work has determined that the alleged lower limit for diamond film growth in the $CO-H_2$ system required at least 25 mole percent hydrogen gas. Finally, although defects arise from the presence of hydrogen, various theoretical approaches have concluded that hydrogen is a necessary part of the reaction steps in forming diamond film in chemical vapor deposition reactions.

It is therefore an object of the invention to provide an improved system and method for manufacturing a diamond film.

It is another object of the invention to provide a novel system and method for manufacturing a diamond film using a plasma gas of argon, hydrogen and a hydrocarbon gas or fullerene compound.

It is an additional object of the invention to provide an improved system and method for manufacturing a diamond film employing argon, 2–19% hydrogen and $CH_4$ or $C_2H_2$.

It is a further object of the invention to provide a novel system and method for manufacturing a diamond film by chemical vapor deposition from decomposition of molecules to form carbon dimers which undergo further decomposition to diamond.

It is yet another object of the invention to provide an improved system and method for manufacturing a diamond film from a fullerene molecular gas decomposed by noble gas/hydrogen gas or nobel gas/fullerene molecule collisions.

It is still an additional object of the invention to provide a novel system and method for manufacturing a diamond film by excitation of an argon/hydrogen gas mixture to metastable states able to transfer energy to a fullerene or hydrocarbon molecule causing decomposition to form the diamond film.

It is also an object of the invention to provide an improved method and system for making a diamond film by microwave energy decomposition of fullerene molecules or compounds consisting of hydrocarbon gases in the presence of a noble gas, such as argon, also in combination with hydrogen.

It is still a further object of the invention to form an abrasion resistant diamond coating by carbon dimer decomposition onto a substrate.

These and other objects of the invention will be described in detail in the detailed description provided hereinbelow and taken in conjunction with the drawings described below.

DETAILED DESCRIPTION OF PREFERRED EMBODIMENTS

Figure 1:
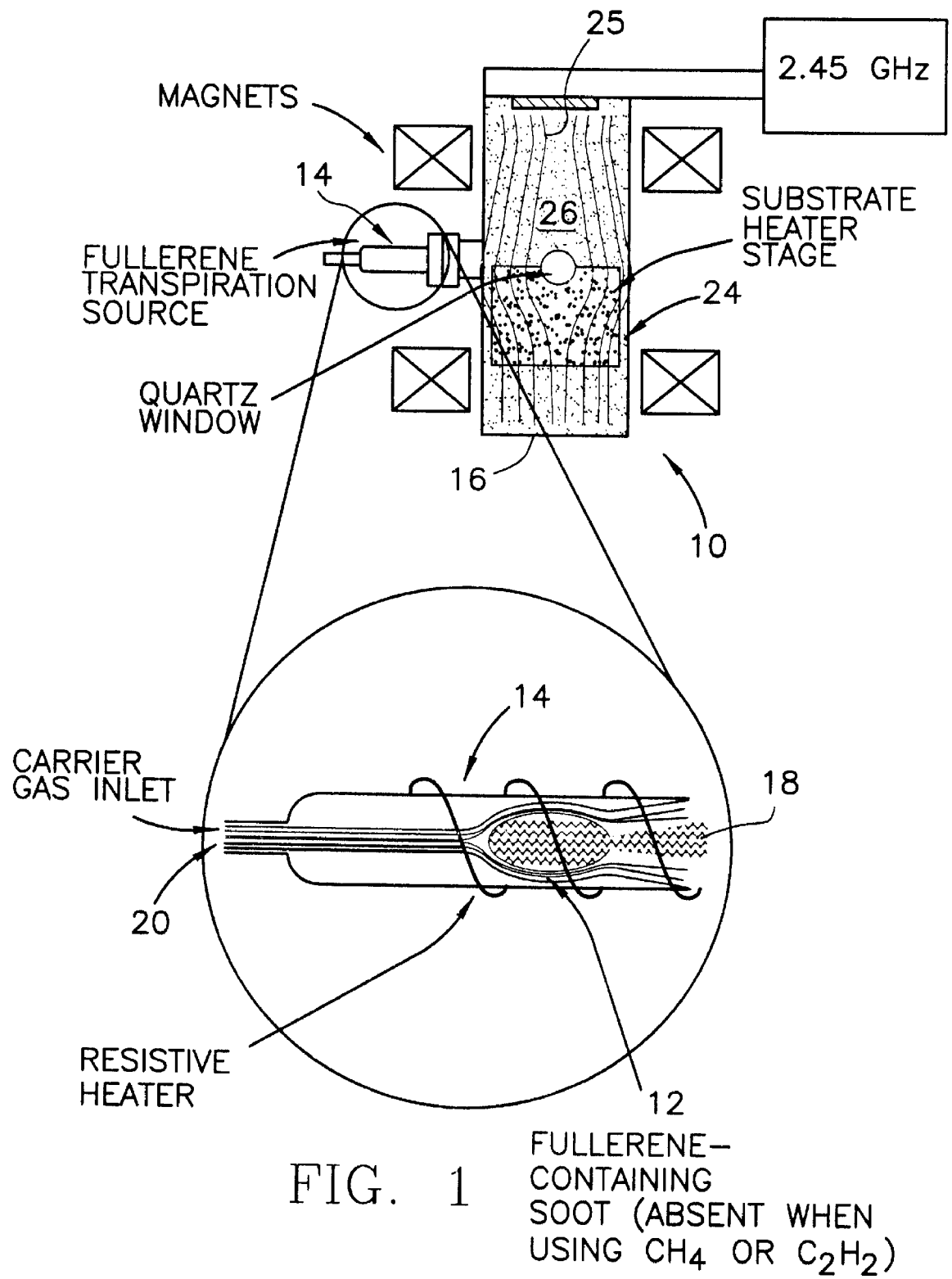
FIG. 1 illustrates a system constructed in accordance with one form of the invention for manufacturing diamond film.

A microwave plasma deposition system 10 (hereinafter "system 10") constructed in accordance with one form of the invention is illustrated in FIG. 1. The system 10 is based on a ASTeX (PDS-17) commercial plasma deposition apparatus manufactured by Applied Science and Technology. Fullerene containing soot 12 used as a starting material was treated to remove hydrocarbon contaminants by contact with methanol. The treated soot 12 was then thoroughly degassed by conventional vacuum and/or thermal treatment (such as heating at 200° C. for 2 hours). The degassed soot 12 was placed in a sublimator 14 which is coupled to plasma deposition chamber 16, and the volume of the sublimator 14 is also coupled to the volume of the plasma deposition chamber 16. Thus, fullerene containing vapor 18 can be introduced into the plasma deposition chamber 16 by heating the sublimator 14 (for example, by Pt resistance wire heating) to a temperature adequate to cause fullerene sublimation (such as, about 550° C. to 600° C.). A noble carrier gas (such as argon) and lower percentages (2–19%) of hydrogen are introduced through gas inlet 20 enabling the gas mixture to transport the sublimed fullerene containing vapor 18 into the plasma deposition chamber 16.

A substrate 22 was used to accumulate deposited carbon as a diamond layer on the substrate 22, and preferably the substrate 22 is a single crystal silicon wafer polished with 0.1 micrometer diamond particles to enhance nucleation density. The substrate 22 can also be disposed on a graphite stage 24, which not only can support the substrate 22 but can act as a heating element to control the substrate temperature. Using a microwave generator 23, a microwave field 25 is established within the plasma deposition chamber 16 in order to generate an excited plasma 26. A variety of gas mixtures and other experimental conditions were utilized to produce diamond layers, and a sampling of representative values are shown in Table 1. Films labeled A–E were grown to comparable thickness to allow direct comparison. Film F was grown to examine properties of thick films grown under the same conditions. Film G was grown under conventional $H_2$—$CH_4$ conditions, and a bare silicon substrate was tested for comparison. Diamond film growth was monitored in situ using laser reflectance interferometry to determine growth rate and allow stopping film growth at a selected thickness.

TABLE 1

| Film | Sample ID # | H₂ Flow sccm | Ar Flow sccm | CH₄ Flow sccm | C₆₀ T-furn °C. | Pres. Torr | Power W | Substr Temp °C. | Growth Rate μm/hr | Diamond Thickness μm | RMS Roughness nm | Friction Coef. | Wear Rate x10⁻⁶ mm³/Nm |
|---|---|---|---|---|---|---|---|---|---|---|---|---|---|
| A | 940825 | 2 | 100 | 0 | 600 | 100 | 1500 | 850 | 0.3 | 1.7 | 30 | 0.05 | 0.2 |
| B | 940926B | 10 | 90 | 0 | 630 | 100 | 1500 | 850 | 0.9 | 2.0 | 105 | 0.18 | 0.15 |
| C | 940927 | 2 | 98 | 0 | 630 | 100 | 1500 | 850 | 0.25 | 2.0 | 41 | 0.04 | 0.1 |
| D | 940928 | 10 | 90 | 0.8 | 20 | 100 | 1500 | 850 | 0.8 | 2.0 | 125 | 0.21 | 0.88 |
| E | 940929 | 1.5 | 98 | 0.8 | 20 | 100 | 1500 | 850 | 0.5 | 2.3 | 53 | 0.08 | 0.4 |
| F | 941013 | 2 | 100 | 1 | 20 | 100 | 800 | 850 | 0.7 | 10 | 45 | — | — |
| G | 950112A | 98 | 0 | 2 | 20 | 60 | 1500 | 850 | 0.4 | 2.0 | 95 | 0.12 | 0.48 |
| Silicon | — | — | — | — | — | — | — | — | — | 0 | <3 | 0.42 | 1.2 |

The system 10 operates to deposit diamond on the substrate 22, and the diamond samples produced were characterized by a variety of conventional materials characterization techniques, such as, X-ray diffraction, Auger electron spectroscopy (AES), electron diffraction, transmission and scanning electron microscopy, atomic force microscopy (AFM), electron energy loss spectroscopy, Raman spectroscopy. In addition, various wear rate tests were performed (see Table 1).

Raman spectra of the films were measured with a Renishaw Raman microscope using a HeNe laser at 632.8 mu with an output of 25 mW focused to a spot size of about 2 um. Raman spectroscopy is widely used to characterize diamond films, although the small grain sizes in these films has a significant effect on the Raman spectrum. Raman spectroscopy revealed a band centered at 1333 cm⁻¹ and a broad band feature at about 1550 cm⁻¹. The 1333 cm⁻¹ band is characteristic of all diamond films regardless of grain size, and the 1550 cm⁻¹ band feature is also commonly observed from small grain size diamond films.

Figure 2:
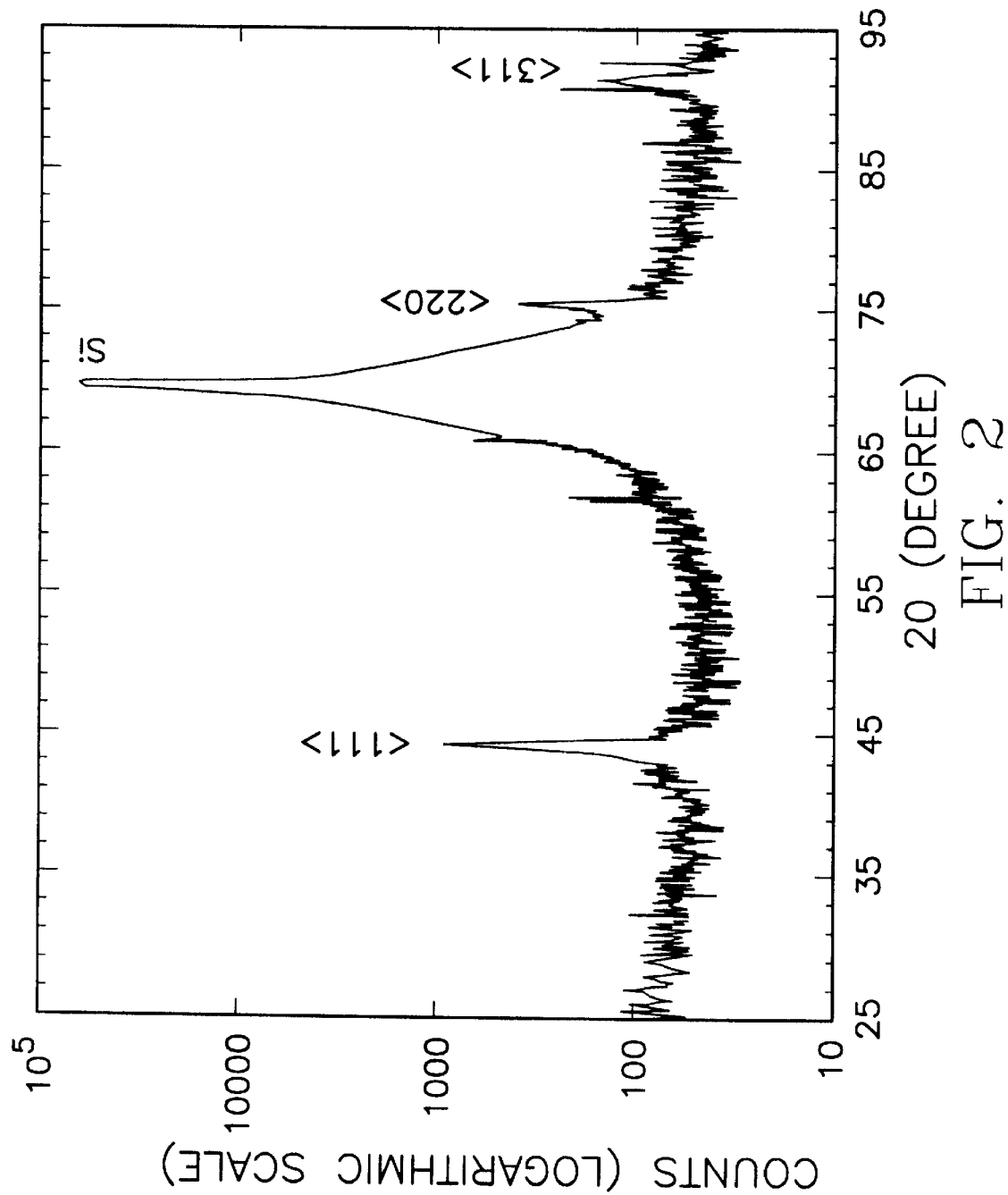
FIG. 2 illustrates an X-ray diffraction pattern for a diamond film on a silicon substrate with diamond grown by one method of the invention.

A Phillips powder diffractometer with Cu $K_\alpha$ radiation was used for XRD measurements to ensure the presence of diamond and check for evidence of crystalline graphite. X-ray diffraction examination of the diamond layers showed the three major diamond diffraction peaks corresponding to the (111), (220) and (311) reflections (see FIG. 2). Particular regions of the diamond layer were also examined by selected area electron diffraction and confirmed the lattice of the film was a face centered cubic structure with lattice constant of 3.53±10 Angstroms (the accepted diamond lattice constant is 3.56 Angstroms).

AES spectra were obtained using a Physical Electronics model 548 spectrometer with a double pass cylindrical mirror analyzer. The carbon KLL peak shape is sensitive to the bonding state of carbon, providing a qualitative means of assessing the $sp^2/sp^3$ ratio of the films. TEM imaging was performed in the JEOL 4000EXII operating at 400 kV. Specimens for TEM were prepared using standard dimpling and ion milling procedures. The surface was characterized using a Burleigh ARIS-3300 AFM to measure the rms surface roughness and a JEOL JXA-840A SEM to image the surface.

Friction and wear tests (see Table 1 for results) were performed with pairs of silicon nitride balls and diamond-coated silicon substrates on a ball-on-disk tribometer. Tests were run in dry nitrogen environments. A Plexiglas cover was fitted over the tribometer, permitting ultra dry environments to be created. Several specimens without the diamond films were also tested, primarily to assess and compare their tribological performance to those with a diamond film. The dead weight applied to the balls was 2N. Frictional force was monitored with the aid of a linear variable-displacement-transducer and was recorded on a floppy disk via a data acquisition system throughout the tests. The rotational velocity was kept between 50 to 150 r/min. to provide sliding velocities of 25 to 40 mm/s. Sliding distance was 200 m. Wear-volume measurements on the balls were based on microscopic determination of the diameter of the circular wear scars. The wear of disk specimens was estimated from the traces of surface profiles across the wear tracks. Duplicate tests were run under conditions described above to check the reproducibility of the friction and wear data.

Figure 4:
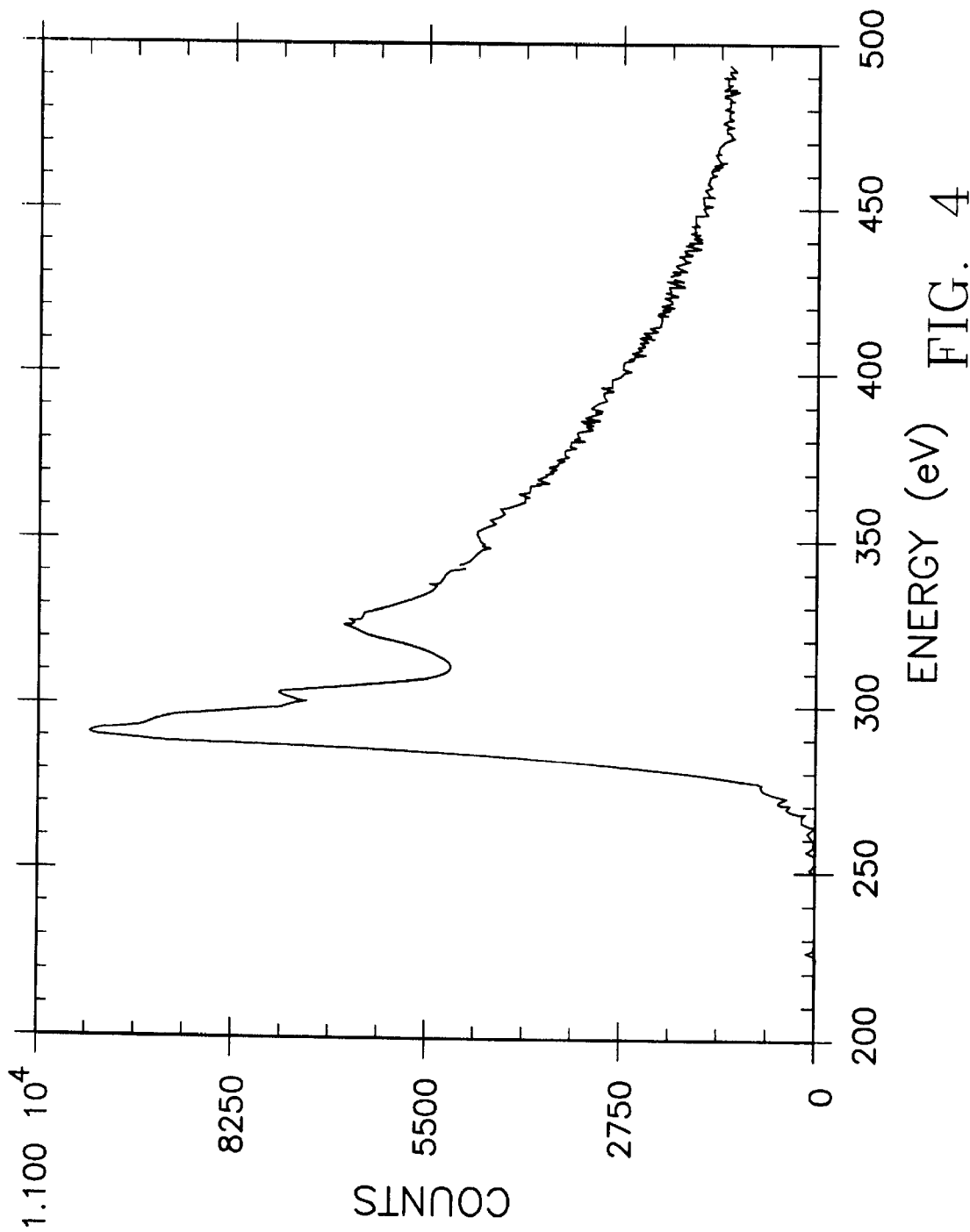
FIG. 4 illustrates an electron energy loss spectrum from a diamond film grown in accordance with one form of the invention.
Figure 5:
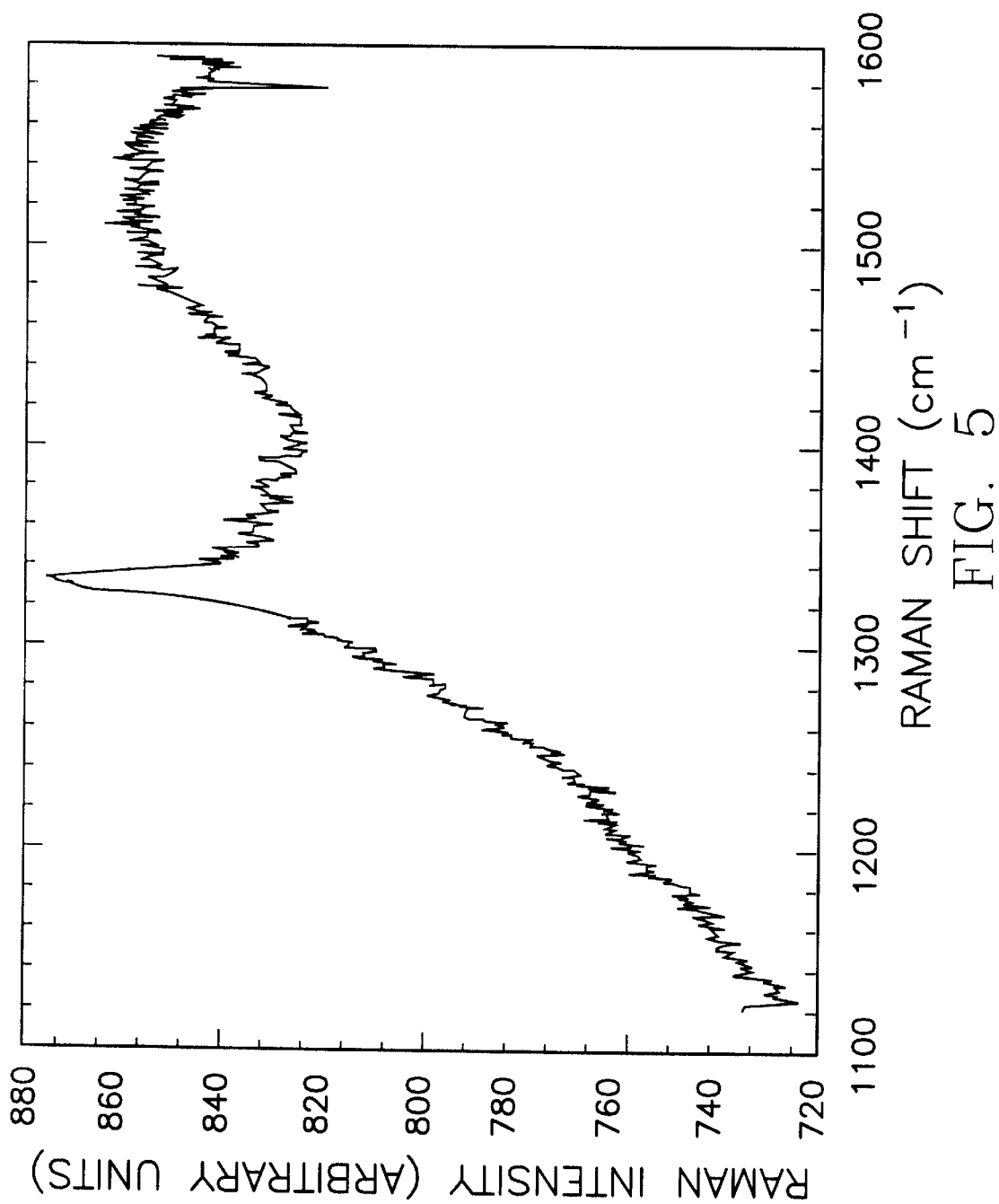
FIG. 5 illustrates a Raman spectrum from a diamond film grown in accordance with one form of the invention.

Transmission electron microscopy further determined that the diamond film was very find grained (about 0.05 to 0.3 microns diameter), and the intergranular boundaries are free from graphitic contamination. Further characterization was performed by electron energy loss spectroscopy. The deposited specimen layers were examined and a K-edge absorption peak was identified at about 291 eV, with no evidence of a graphite or amorphous carbon peak at 285 eV (see FIG. 4).

In another embodiment of the invention, additional diamond films were grown in the system 10 (a microwave plasma chemical vapor deposition reactor, ASTeX PDS-17 as previously described). The films were grown on silicon substrates polished with 0.1 μm diamond particles to enhance nucleation. In-situ diagnostics included plasma emission spectroscopy and surface reflectivity measurements. Raman spectroscopy was performed on the films ex-situ to ensure that diamond films were in fact grown.

Emission from the plasma was collected with a quartz optical fiber by viewing a region 1–2 cm above the substrate 22. The light was transmitted to an Interactive Technology model 103 optical monochrometer with entrance and exit slit widths of 50 μm and 400 μm respectively. The monochrometer was stepped in 2.3 Å increments with a dwell time of 100 msec from 3000 Å to 8000 Å. The dispersed light was detected with a Peltier-cooled photomultiplier tube. The reflectivity of the growing film surface was measured using a 5 mW HeNe laser. The reflected beam was passed through a HeNe laser line filter to eliminate plasma emissions and detected with a photodiode. The oscillations in the reflectivity were used to calculate the film thickness as a function of time and thus provide a measure of the growth rate. A Macintosh IIci was used to control the spectrometer and acquire data from both the spectrometer and photodiode. Raman measurements of the films were performed with a Renishaw Raman microscope using a HeNe laser at 6328 Å.

Plasma emission is observed when atoms or molecules in a plasma are excited to higher energy electronic states which decay mainly by radiative processes. The excited states may also decay by collisional quenching, and for larger molecules, by intermolecular non-radiative processes. Thus, many of the species in the plasma which are or interest, for example $CH_3 \bullet$ and $C_2H_2$, cannot be detected by plasma emission measurements. The emission intensity, proportional to the excited state population of the species, is somewhat difficult to relate to the ground state population because changes in plasma conditions can produce changes in the emission intensity of a species by changing not only the ground state population, but also the excitation rate and the competing deexcitation mechanisms such as quenching. This makes use of plasma emission somewhat difficult for quantitative measurement of ground state species concentrations. Nevertheless, it is believed that the very large changes in emission by $C_2$ relative to other emitting species observed in our experiments, especially those with similar excitation energies, are in fact correlated with an increase in the ground state $C_2$ population. The species observed by plasma emission in these experiments are listed in Table 2. The increases in $C_2$ emission intensity relative to H, Ar, and CH are evidence of an increase in the ground state concentration of $C_2$ in the plasma, though not necessarily a linear increase.

TABLE 2

| Species | Transition | Wavelength Å | Excited State Energy (eV) |
|---|---|---|---|
| H | $^2P^o3/2 \rightarrow {}^2S1/2$ | 6560 | 12.1 |
| Ar | $4_p'[1/2]_o \rightarrow 4s'[1/2]_1^o$ | 7504 | 13.5 |
| $C_2$ | $d^3\Pi_g \rightarrow a^3\Pi_u$ | 5165(0–0) | 2.5 |
| CH | $A^2\Delta \rightarrow X^2\Pi_r$ | 4314(0–0) | 2.9 |

Figure 13:
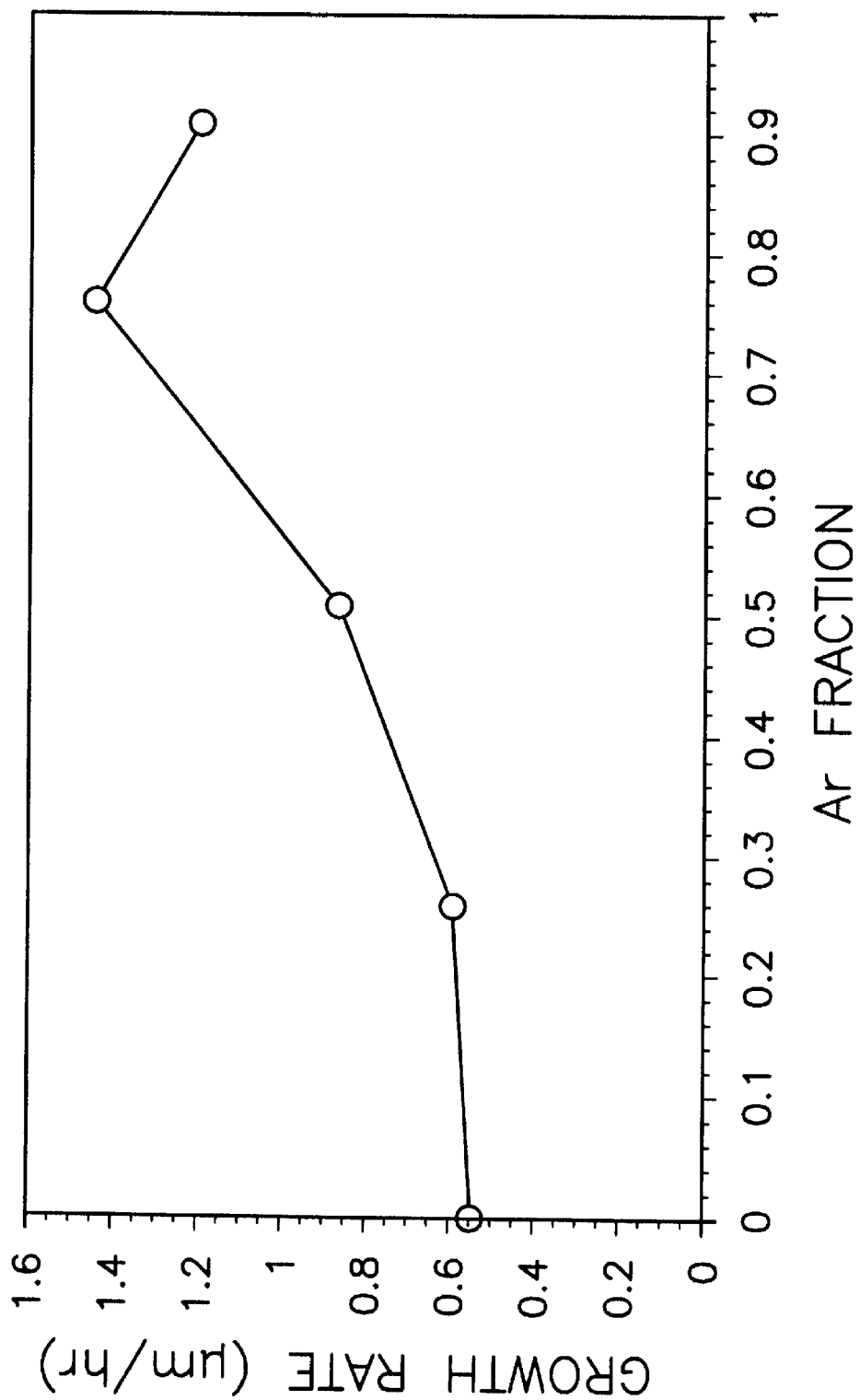
FIG. 13 shows growth rate determined by surface reflectivity and the rate increases with increasing argon fraction to a peak value near a fraction of 0.75; the growth rate increases by nearly a factor of three over the argon free condition.

The fraction of Ar in the reactor was varied to determine the effect on growth rate and plasma emission for the five conditions shown in Table 3. The total flow of gas to the reactor is kept constant with increasing amounts of argon substituted for hydrogen. For each condition, the gas flow was set and the emission spectrum measured after the growth ratio equilibrated. The growth rate is observed to increase with increasing argon fraction to a peak value for an argon fraction near 0.75 (data condition 4) and as shown in FIG. 13. The argon addition leads to growth rates of up to a factor of three greater than that of hydrogen-methane. The change in gas composition has a large effect on the gas phase chemistry, as evidenced by the emission spectrum.

TABLE 3

Power: 1500 W
Pressure: 80 Torr
Temperature: 850° C.

| Data Point | $H_2$ Flow (sccm) | Ar Flow (sccm) | $CH_4$ Flow (sccm) |
|---|---|---|---|
| 1 | 100 | 0 | 2 |
| 2 | 75 | 25 | 2 |
| 3 | 50 | 50 | 2 |
| 4 | 25 | 75 | 2 |
| 5 | 10 | 90 | 2 |

Figure 14:
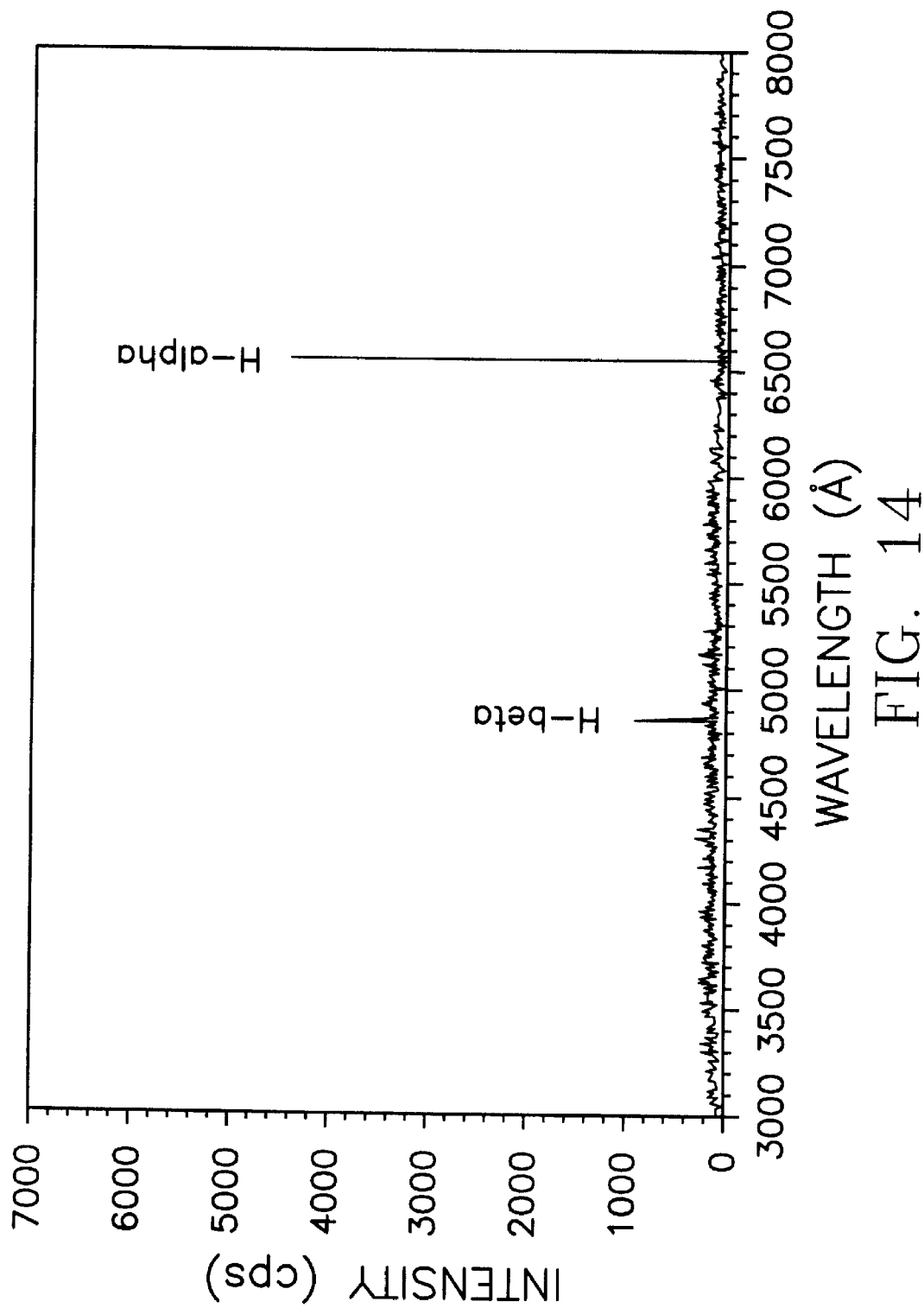
FIG. 14 shows an emission spectrum from a 100 sccm $H_2$ and 2 sccm $CH_4$ plasma; only H-alpha and H-beta emission lines from atomic hydrogen are observed.
Figure 15:
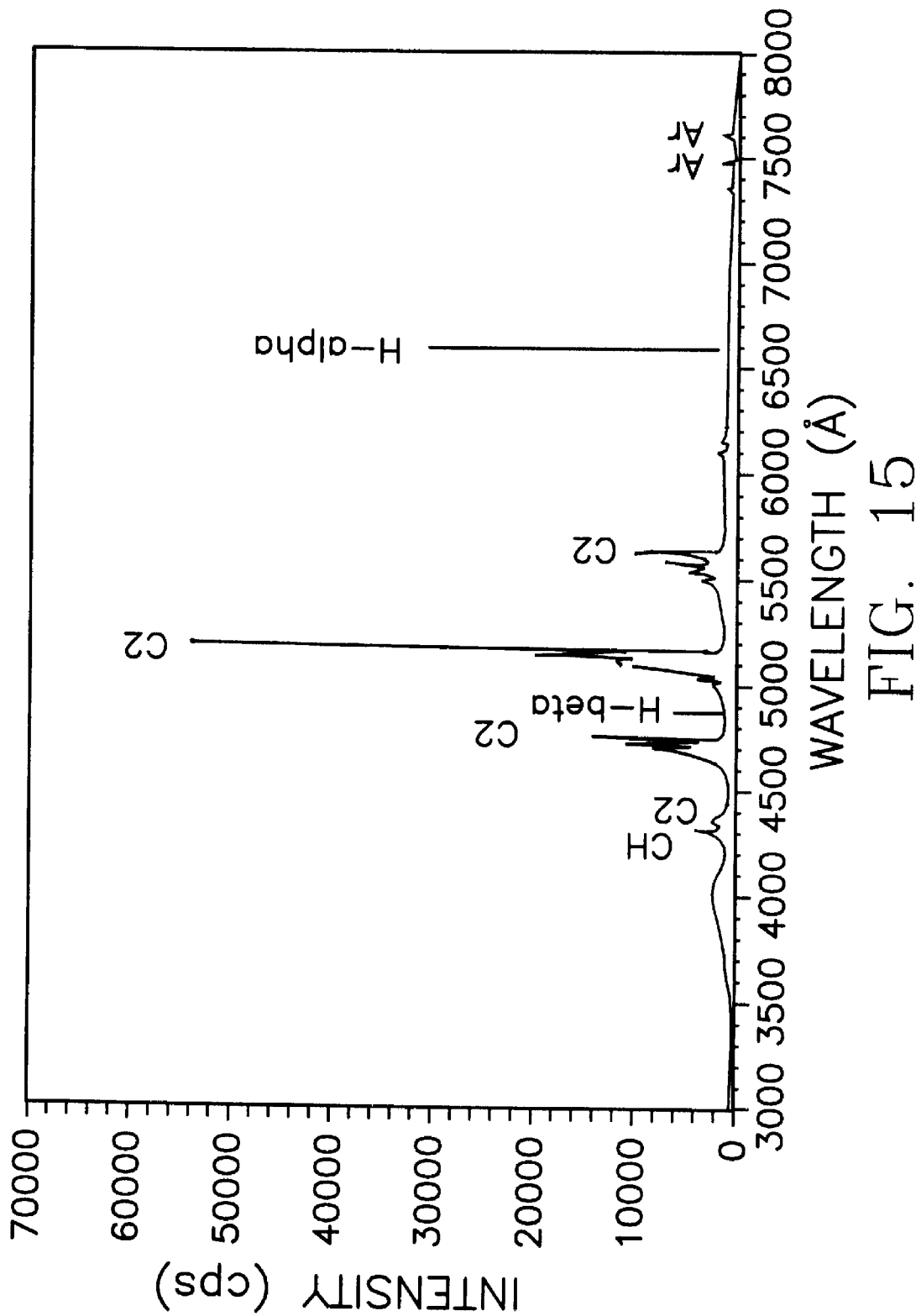
FIG. 15 shows an emission spectrum from 25 sccm $H_2$, 75 sccm Ar and 2 sccm $CH_4$ plasma; the $C_2$ Swan bands and atomic hydrogen lines are prominent, while the CH band at 4310 Å and atomic argon lines at 7504 Å and 7635 Å are distinguishable.
Figure 16:
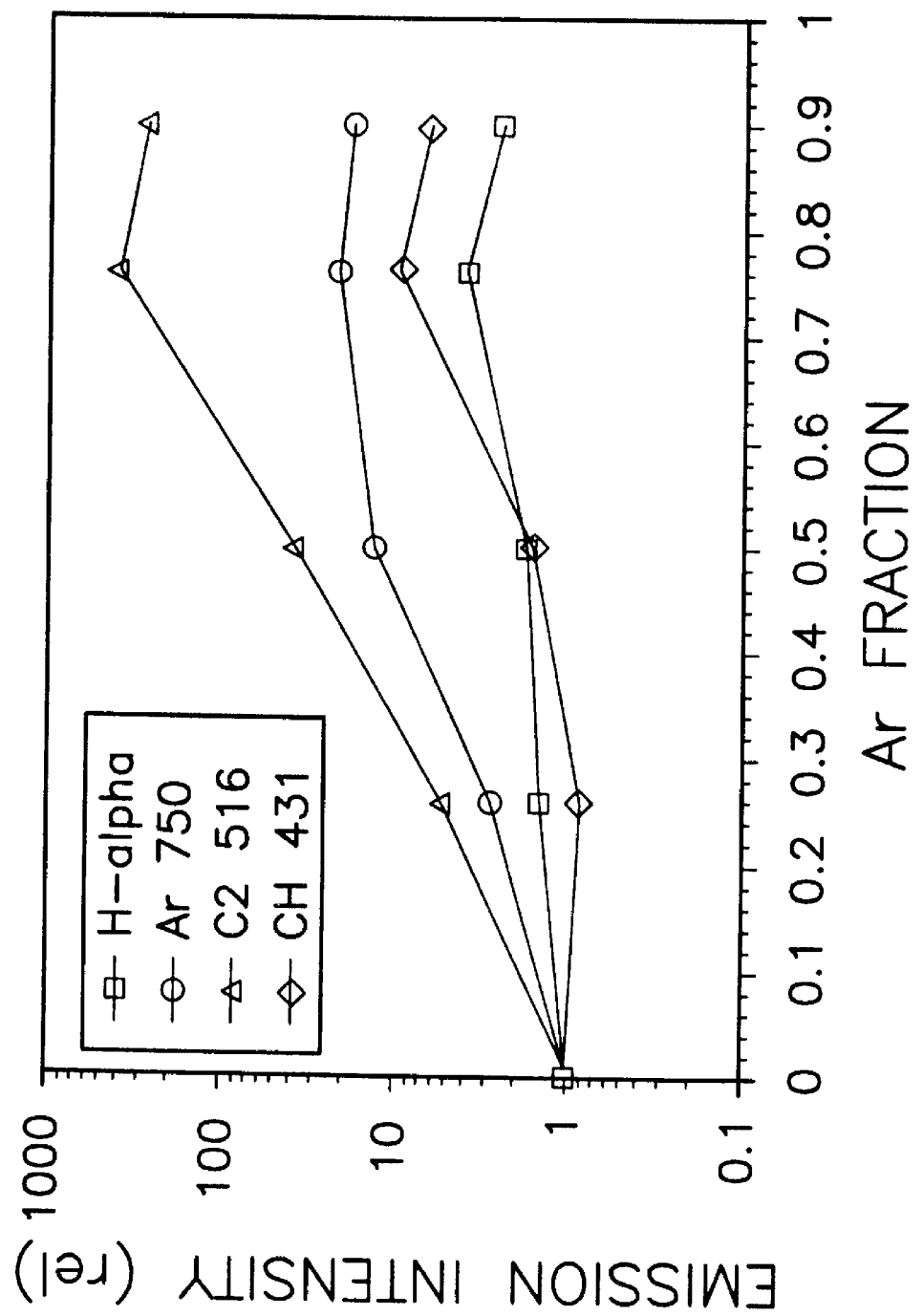
FIG. 16 shows emission intensities from H 6560 Å, Ar 7504 Å, $C_2$ 5160 Å band, and CH 4310 Å band and these are plotted as a function of Ar fraction; $C_2$ emission increases by the greatest amount and increases in intensity relative to other emitting species, indicating an increase in gas phase concentration.

Emission spectra for data condition 1 (100 sccm $H_2$, 2 sccm $CH_4$) and condition 4 (25 sccm $H_2$, 75 sccm Ar, 2 sccm $CH_4$) are shown in FIGS. 14 and 15. For condition 1, the atomic hydrogen lines are very prominent with little emission from other species. By contrast, the high Ar fraction for condition 4 results in prominent emission bands, particularly from $C_2$. Emission from CH, as well as lines from Ar and H, are also evident. The intensities of H-alpha (6560 Å), Ar (7504 Å), $C_2$ (5160 Å band) and CH (4310 Å band) are plotted as a function of Ar fraction in FIG. 16. The intensities were normalized to values of unity for condition 1. $C_2$ emission increases by as much as a factor of 500, and by an order of magnitude relative to other emitting species, reflecting (as mentioned earlier) an increase in the gas phase concentration of $C_2$. It is interesting to note that the emission intensity drops when the argon fraction was increased from 0.75 to 0.90, and the growth rate also decreased. This reproducible phenomenon is currently being investigated by us in detail.

In a second experiment, $H_2$ and Ar flows were maintained at 50 sccm while the $CH_4$ flow was varied from 1 to 5 sccm. Measurements of growth rate and plasma emission were made for seven conditions shown in TABLE 4. Again, for each condition the gas flow was set, and the emission spectrum was measured after the growth rate equilibrated.

TABLE 4

Power: 1500 W
Pressure: 100 Torr
Temperature: 850° C.

| Point | $H_2$ Flow (sccm) | Ar Flow (sccm) | $CH_4$ Flow (sccm) |
|---|---|---|---|
| 1 | 50 | 50 | 1 |
| 2 | 50 | 50 | 1.5 |
| 3 | 50 | 50 | 2 |
| 4 | 50 | 50 | 2.5 |
| 5 | 50 | 50 | 3 |
| 6 | 50 | 50 | 4 |
| 7 | 50 | 50 | 5 |

Figure 17:
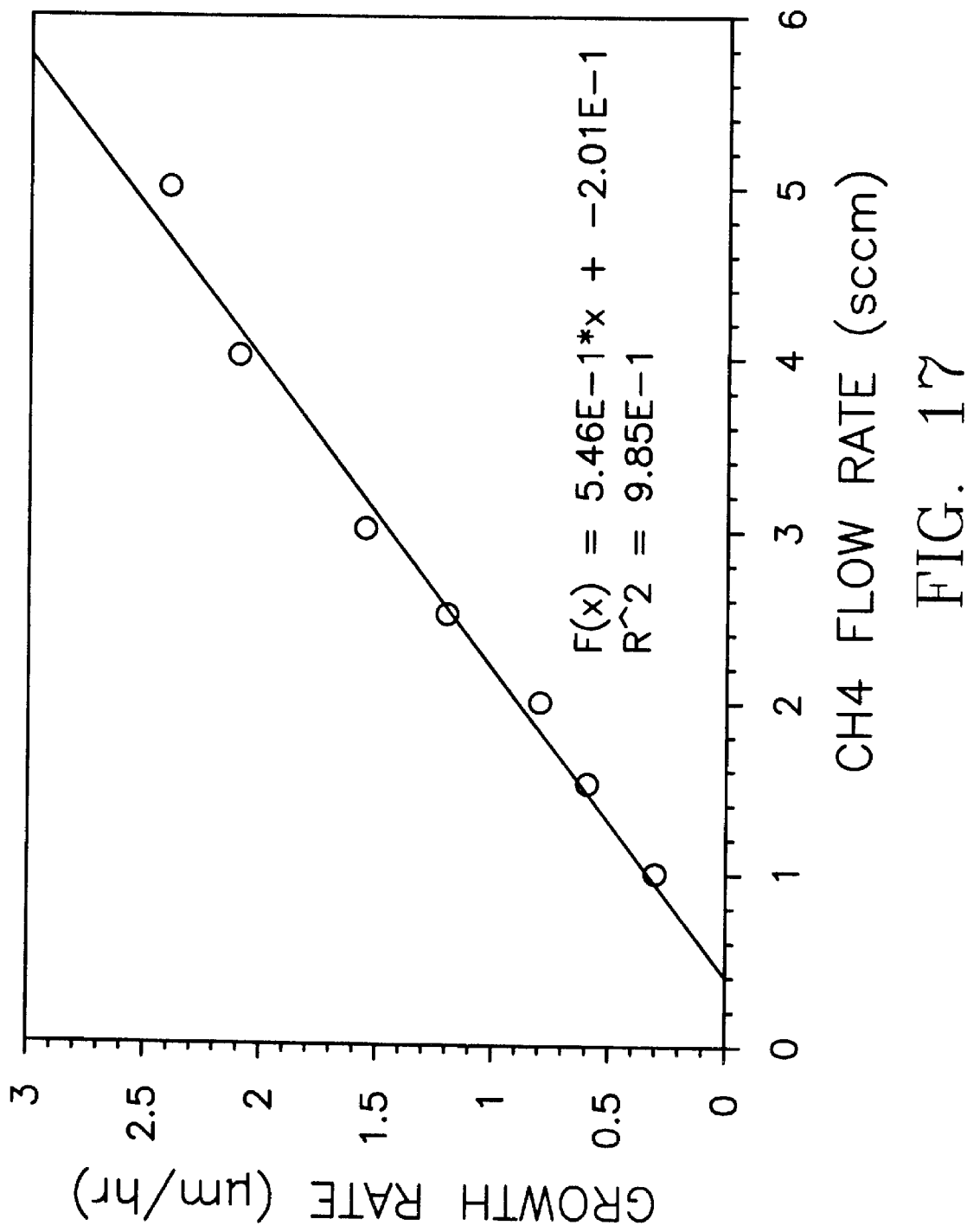
FIG. 17 shows the growth rate determined by the surface reflectivity and the rate increases linearly with $CH_4$ flow.
Figure 18:
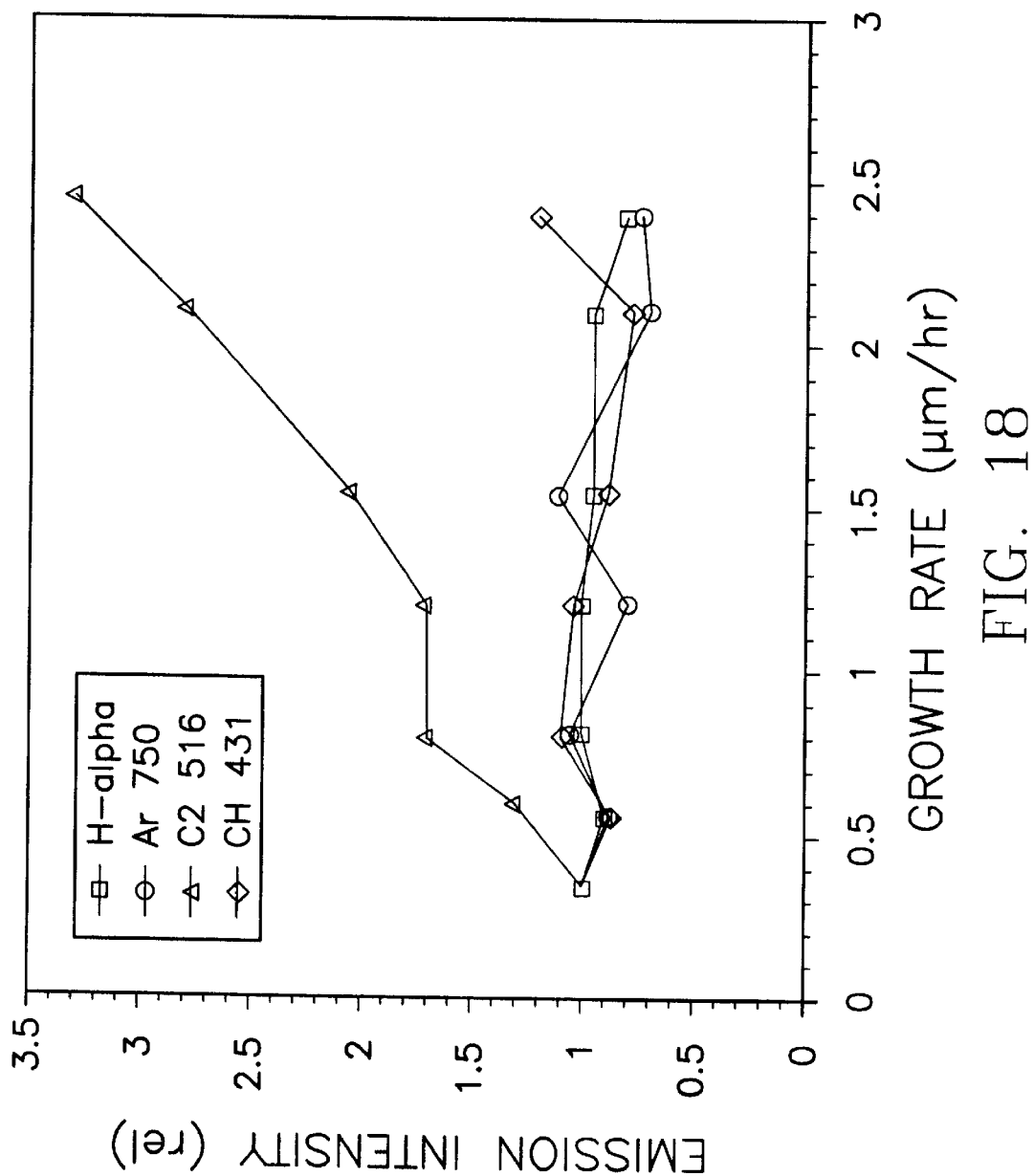
FIG. 18 shows plasma Emission intensities observed as a function of growth rate for a second experiment; the $C_2$ emission increases linearly with growth rate, while emission from other species is nearly constant identifying $C_2$ as the growth species.

In this set of experiments, the growth rate increased linearly with increasing $CH_4$ flow as shown in FIG. 17. The changes in $CH_4$ flow result in small changes in the gas composition and can be thought of as a perturbation to the plasma. Since excitation and quenching rates can be expected to change only marginally under these conditions the emission intensity is likely correlated with ground state species concentrations in the plasma. The emission intensities of H, Ar, $C_2$ and CH are plotted as a function of growth rate in FIG. 18, normalized to unity at condition 1. The emission intensities of H, Ar and CH remain nearly constant as the growth rate increases, while $C_2$ increases linearly with growth rate. Thus, we conclude that the $C_2$ gas phase concentration is correlated with growth rate.

Figure 19:
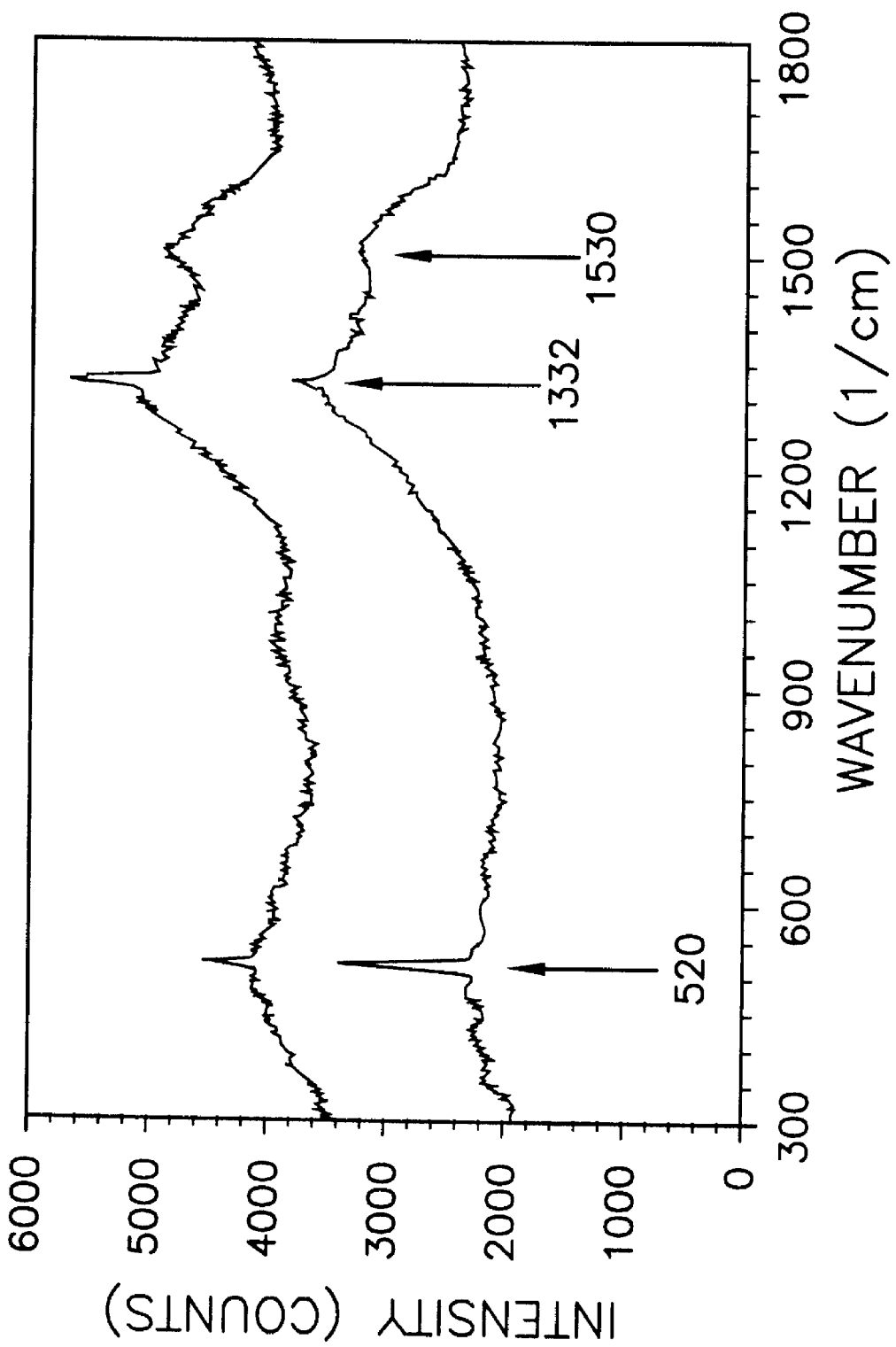
FIG. 19 shows Raman spectra of the films produced in the two experiments; the lower spectrum is from the first experiment, where the Ar fraction in the reactor was varied; the upper spectrum is from the second experiment, where methane flow was increased.

Finally, Raman spectra for the two films grown in the above experiments are shown in FIG. 19 to confirm that diamond was indeed deposited. The lower spectrum is from the first film, where the Ar gas fraction was varied. The film was 2.8 μm thick and the diamond peak at 1332 cm$^{-1}$ is clear. The broad features at 1530 cm$^{-1}$ and 1330 cm$^{-1}$ have been attributed to the presence of nondiamond carbon. The Raman spectra were measured using a HeNe laser, which results in stronger scattering from the nondiamond carbon phases relative to diamond as compared to the commonly used argon ion laser. The transparency of the film is evident from the silicon peak at 520 cm$^{-1}$, which results from the silicon substrate under the film. The upper spectrum is from the second film, grown under varying methane concentrations. This film was 4 μm thick. The diamond peak is more pronounced than in the first film, but the features otherwise appear similar. From this we conclude the films grown from $CH_4/H_2/Ar$ mixtures are predominantly diamond.

Additional support for this conclusion of the films being diamond comes from a measurement of the refractive index of the films. The above-described film thickness was measured to be 4.0±0.03 μm, while the reflectivity of the surface underwent 31.5 oscillations. The index of refraction is related to the film thickness and the number of oscillations by $$n = \frac{m\lambda}{2d}$$

where $\lambda$ is the laser wavelength (0.6328 $\mu$m), m is the number of oscillations in the reflectance (31.5) and d is the film thickness (4.0±0.3 $\mu$m). From this, the index of refraction of the film is calculated to be 2.5±0.2. This is within error of the accepted value of 2.41 for bulk diamond at this wavelength.

As previously discussed, $C_2$ deposition to form diamond is energetically favorable. Ab initio calculations indicate that $C_2$ insertion into CH bonds is energetically favorable with small activation barriers. Initial calculations for $C_2$ insertion into CC bonds indicate this is also energetically favorable with low activation barriers.

Figure 20:
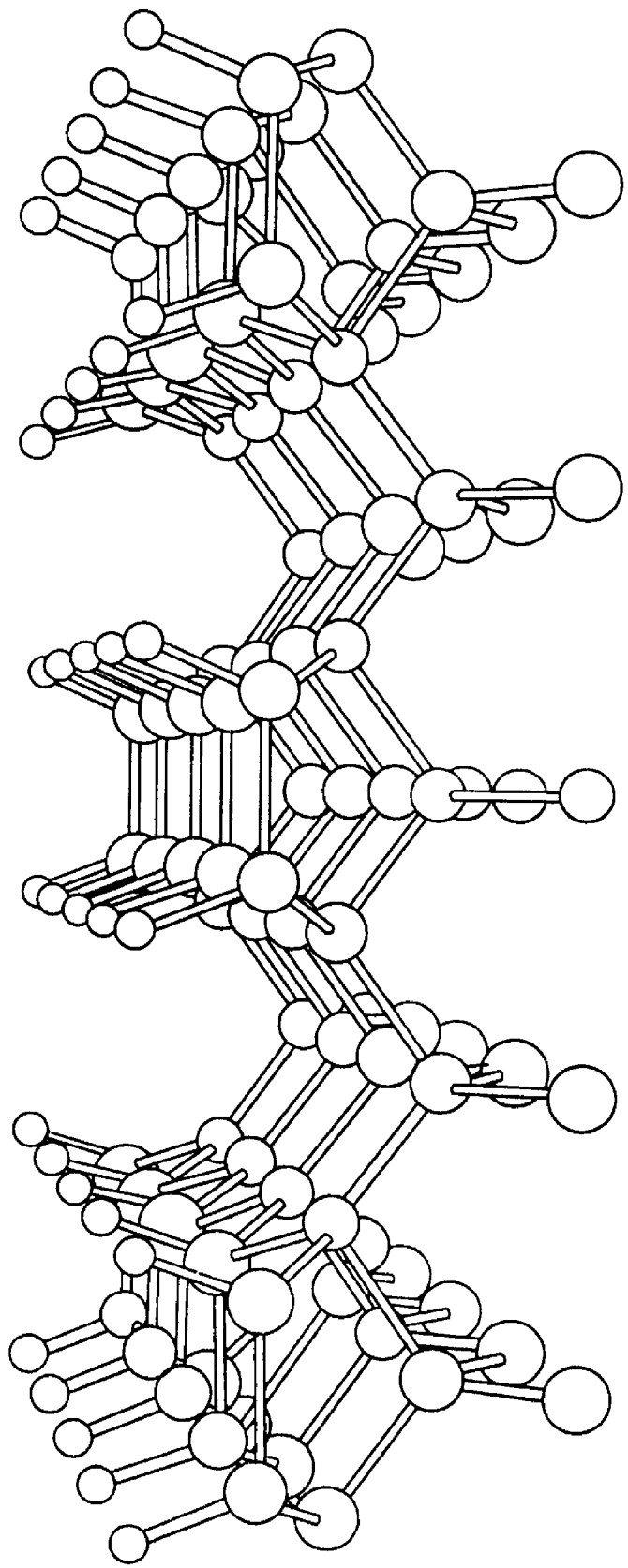
FIG. 20 shows a (100) (2×1):H reconstructed diamond surface.
Figure 21:
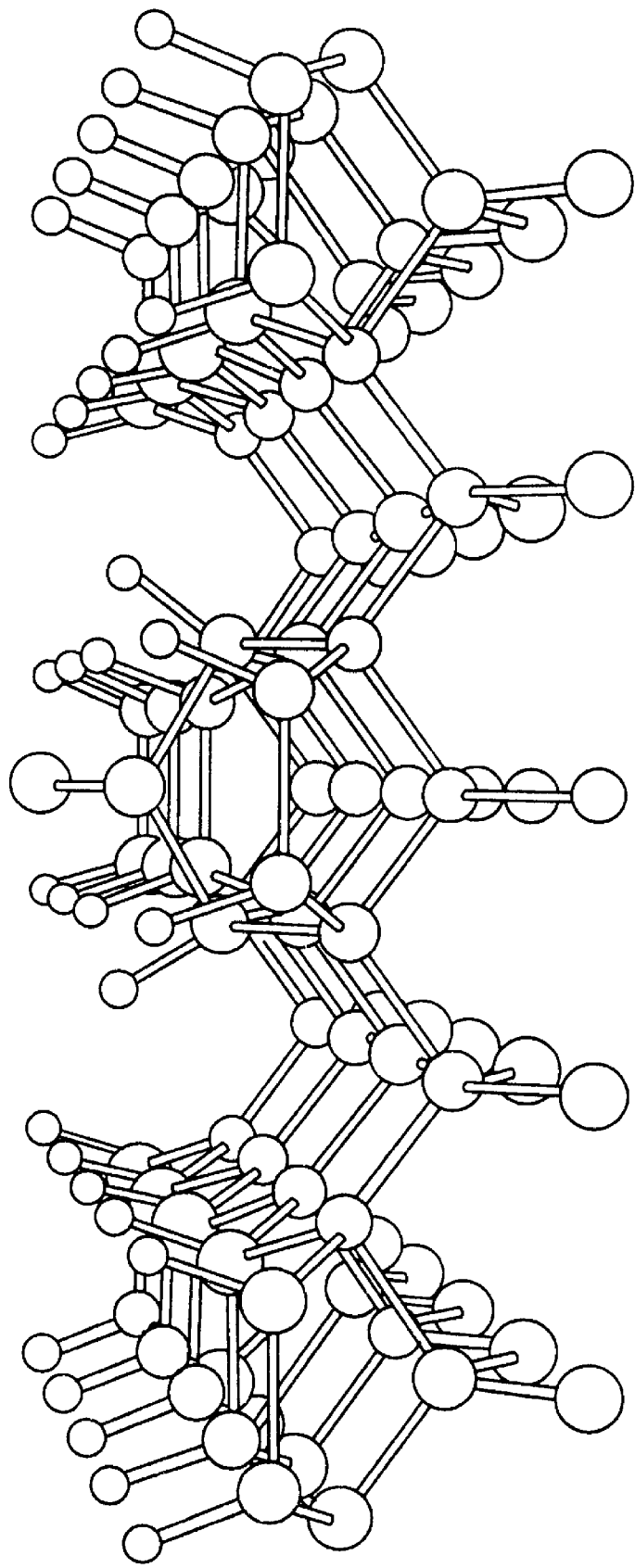
FIG. 21 shows a $C_2$ molecule inserted into a C—C surface dimer bond.
Figure 22:
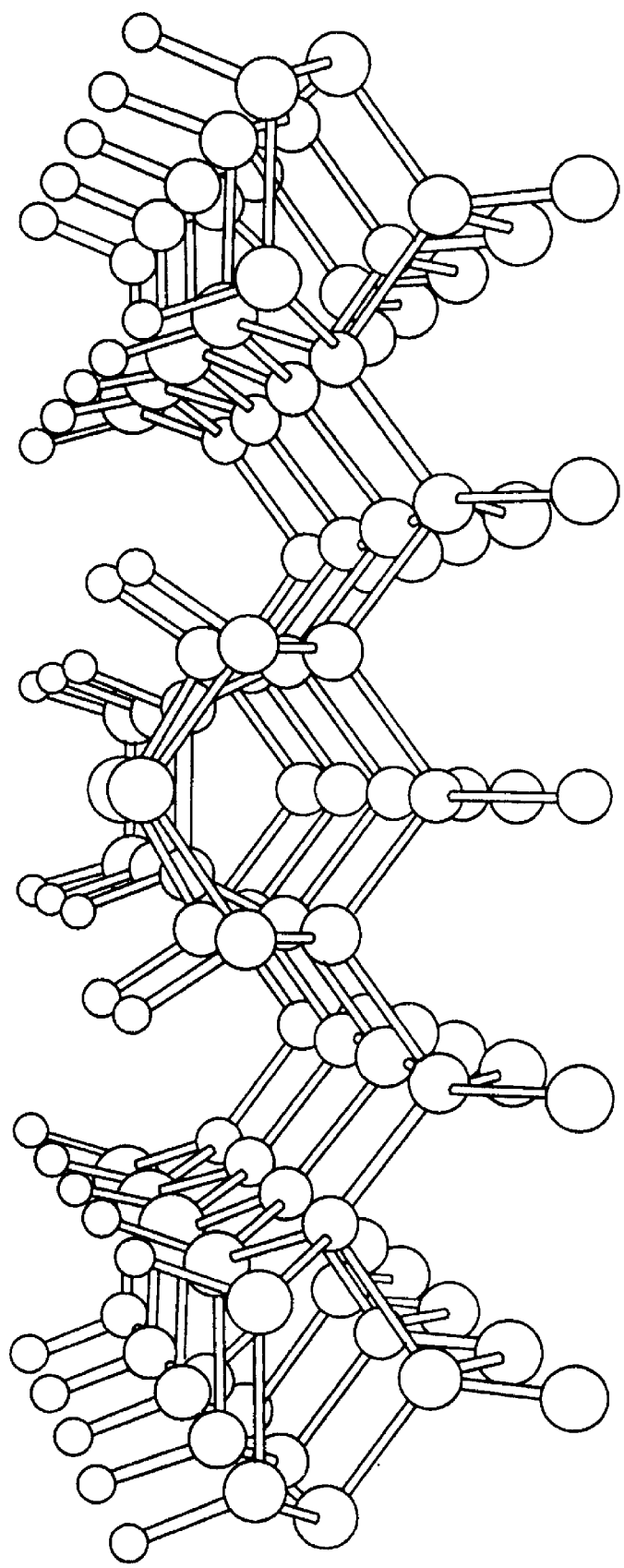
FIG. 22 shows a $C_2$ molecule inserted into an adjacent C—C surface dimer bond, forming a new surface dimer perpendicular to the previous dimer row.
Figure 23:
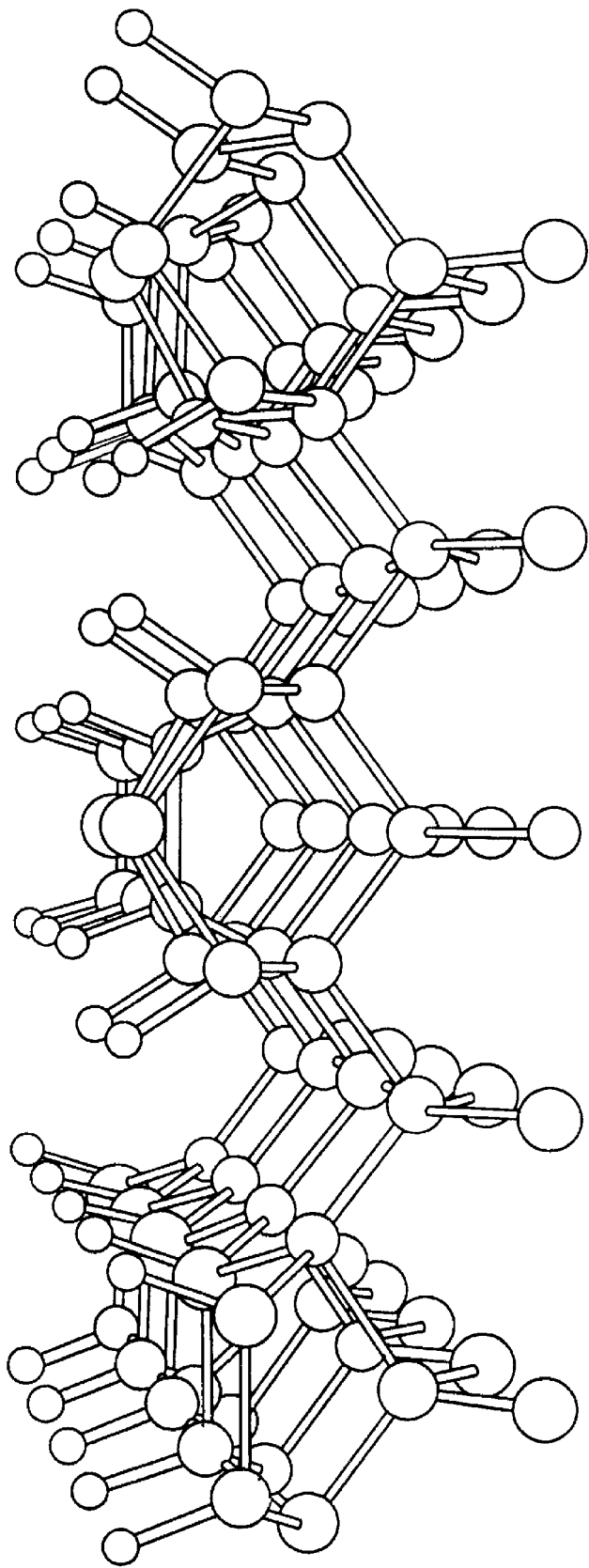
FIG. 23 shows a second $C_2$ molecule forming a new surface dimer in an adjacent dimer row.
Figure 24:
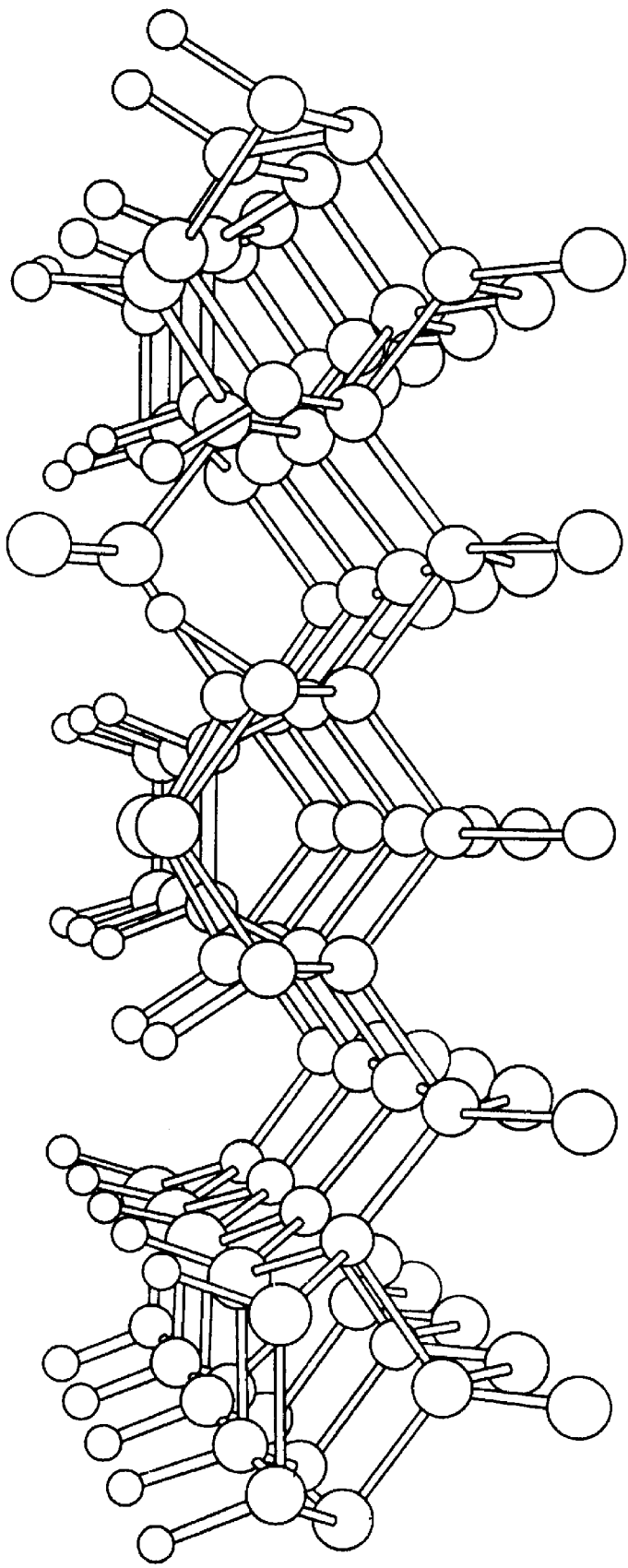
FIG. 24 shows a third $C_2$ molecule inserted into the trough between the two previously incorporated $C_2$ molecules.
Figure 25:
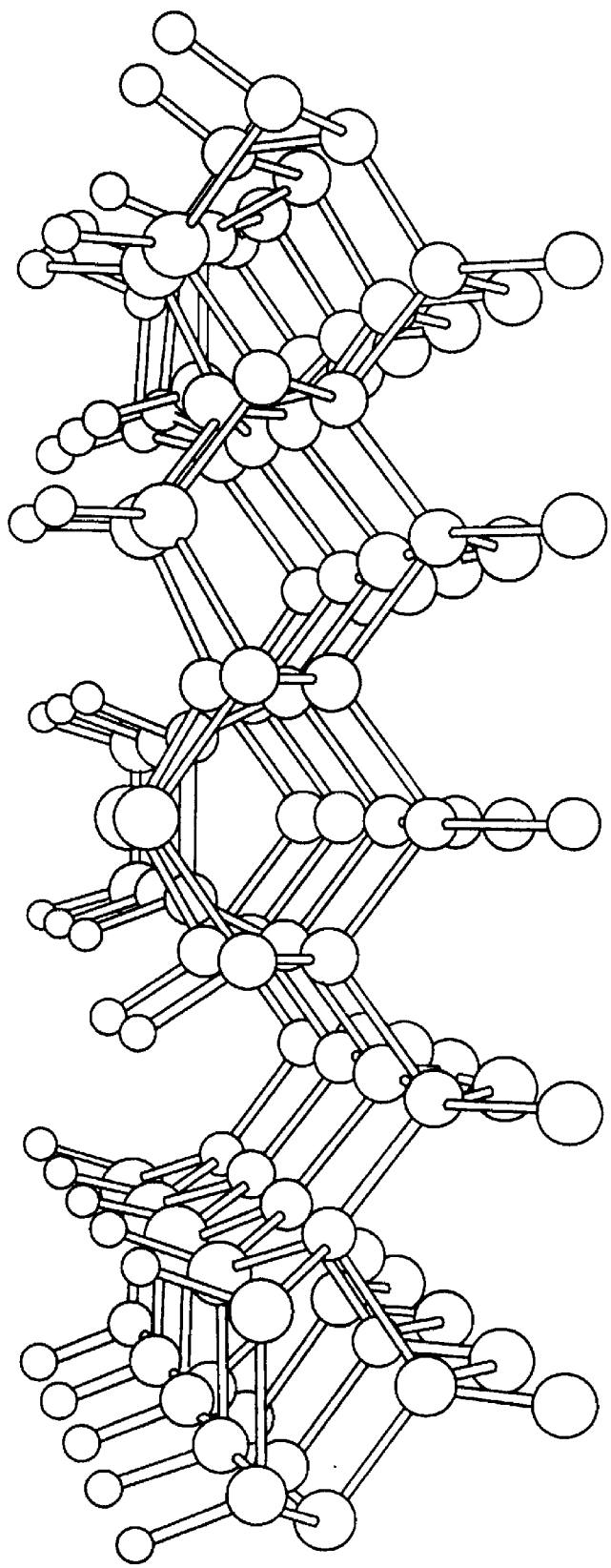
FIG. 25 shows the third $C_2$ molecule completing insertion into the trough, forming a dimer row perpendicular to the previous surface row.

Without limiting the scope of the invention, in FIGS. 20–25, a proposed mechanism for growth on the diamond (100) (2×1):H reconstructed surface with $C_2$ is outlined. FIG. 20 shows the (100) (2×1):H reconstructed diamond surface, thought to be the most likely surface in these environments. The large atoms are C and the small atoms are H terminating the surface. A $C_2$ molecule impinges on the surface and inserts into a surface C—C dimer bond, as shown in FIG. 21. The $C_2$ then inserts into an adjacent C—C bond to form a new surface carbon dimer, as shown in FIG. 22. By the same process, a second $C_2$ molecule forms a new surface dimer on an adjacent row, as shown in FIG. 23. A third $C_2$ molecule inserts into the trough between the two new surface dimers as shown in FIGS. 24 and 25. The three $C_2$ molecules incorporated into the diamond surface form a new surface dimer row running perpendicular to the previous dimer row. The $C_2$ growth mechanism as proposed here requires no hydrogen abstraction reactions from the surface and in principle should proceed in the absence of hydrogen.

The following nonlimiting examples set forth exemplary embodiments of the inventions:

EXAMPLE I

A $C_{60}$ sublimation source was coupled to a microwave chamber operated with a microwave generator at 2.5 GHz. The system as a whole is an ASTeX PDS-17 unit supplied by Applied Science and Technology. Fullerene containing soot was made in a conventional manner or was obtained from MER Corporation. (e.g. about 10% $C_{60}$ in the soot). The soot was treated with methanol to remove most of the hydrocarbon constituents. The cleaned soot was place in a gold container which in turn was disposed in a quartz tube wound with nichrome wire used to heat the soot. The microwave chamber was evacuated and the soot heated to about 200°–250° C. for two hours to remove residual methanol solvent, hydrocarbons and absorbed gases. The rate of $C_{60}$ sublimation was determined by placing a silicon wafer in front of the outlet of the sublimation source inside the microwave chamber. An argon gas flow of 20 sccm with a total pressure in the chamber of 100 Torr was established by use of a carrier gas inlet into the sublimation source. The sublimation source was maintained at about 500° C., and adequate $C_{60}$ was deposited in one-half an hour on the silicon single crystal so that a typical $C_{60}$ infrared absorption spectrum could be easily noted. Raman spectroscopy confirmed the presence of $C_{60}$. There were no features in the infrared spectrum that could be attributed to species other than $C_{60}$.

EXAMPLE II

The same manufacturing procedure set forth in Example I was followed except the silicon wafer was removed, and fresh soot was placed in the sublimation source. The temperature of the sublimation source was raised to about 500° C., the microwave generator was activated and a 500 watt microwave discharge was initiated at 1 Torr argon. A quartz fiber optic cable was coupled to the microwave chamber to enable viewing of the plasma discharge at a region about 1–1.5 cm above the silicon substrate. The light within the fiber optic cable was transmitted to an Interactive Technology model 103 optical monochromator with 200 micron entrance and exit slit widths. The monochromator wavelength was stepped in increments of about 2.3 Angstroms with a dwell time of about 100 msec/step. The light detector was a Peltier cooled photomultiplier tube operating in a pulse counting mode with a dark count rate of 20–30 cps. A Macintosh IIci control computer was used with software to provide a 100 msec gating pulse to the 32 bit National Instruments counter board located in the computer back plane.

Figure 3A:
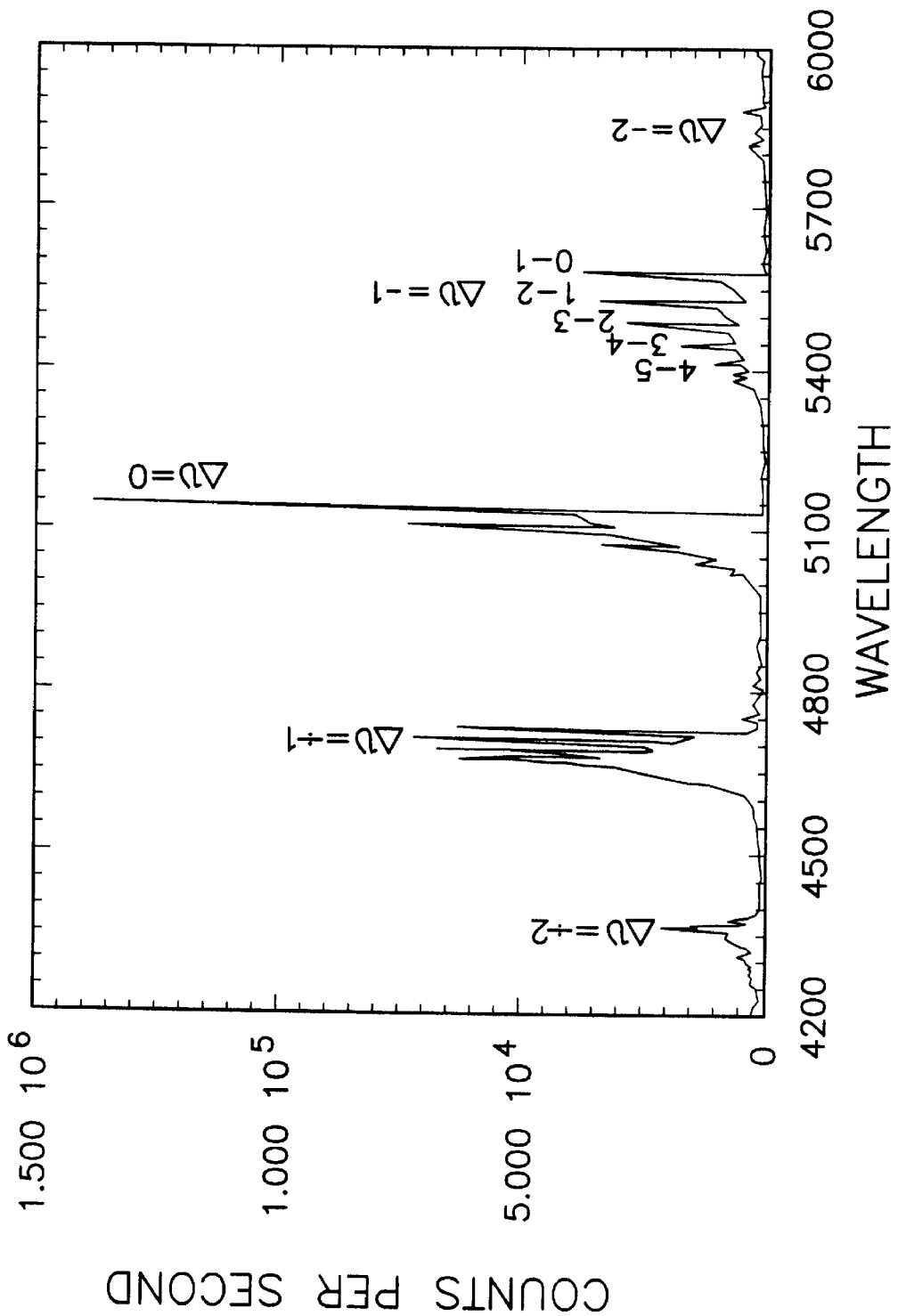
FIG. 3A illustrates an emission spectrum for a plasma in the system of the invention.
Figure 3B:
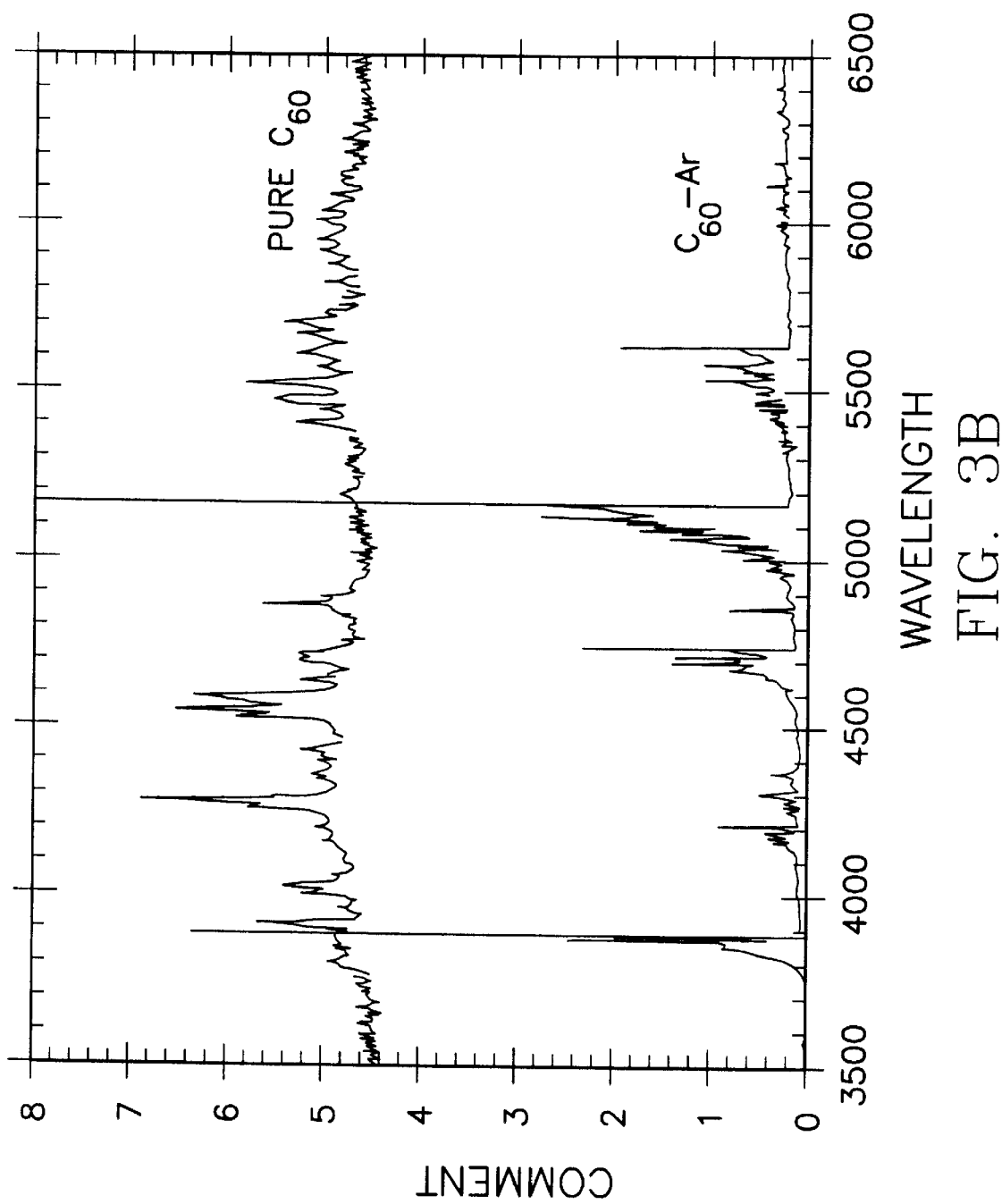
FIG. 3B compares the plot of FIG. 3A to the spectrum for a plasma without a noble carrier gas present (top plot)

A typical spectrum obtained from the intensely emerald green plasma discharge is shown in FIG. 3A. The spectrum is dominated by the $d^3\Pi g - a^3\Pi\mu$ Swan bands of $C_2$, particularly the $\Delta v = -2, -1, 0, +1, +2$ sequences. This can be compared to the spectral output in the absence of a noble carrier gas as shown in FIG. 3B which does not exhibit $C_2$ bands.

It should also be noted that intense emissions are also observed characteristic of excited argon atoms in the 6000–8000 Angstrom range. Argon neutrals in such metastable states as $^3P_2$ at 11.55 eV can lead to efficient energy transfer to the $C_{60}$ molecules and consequent fragmentation.

EXAMPLE III

Figure 3C:
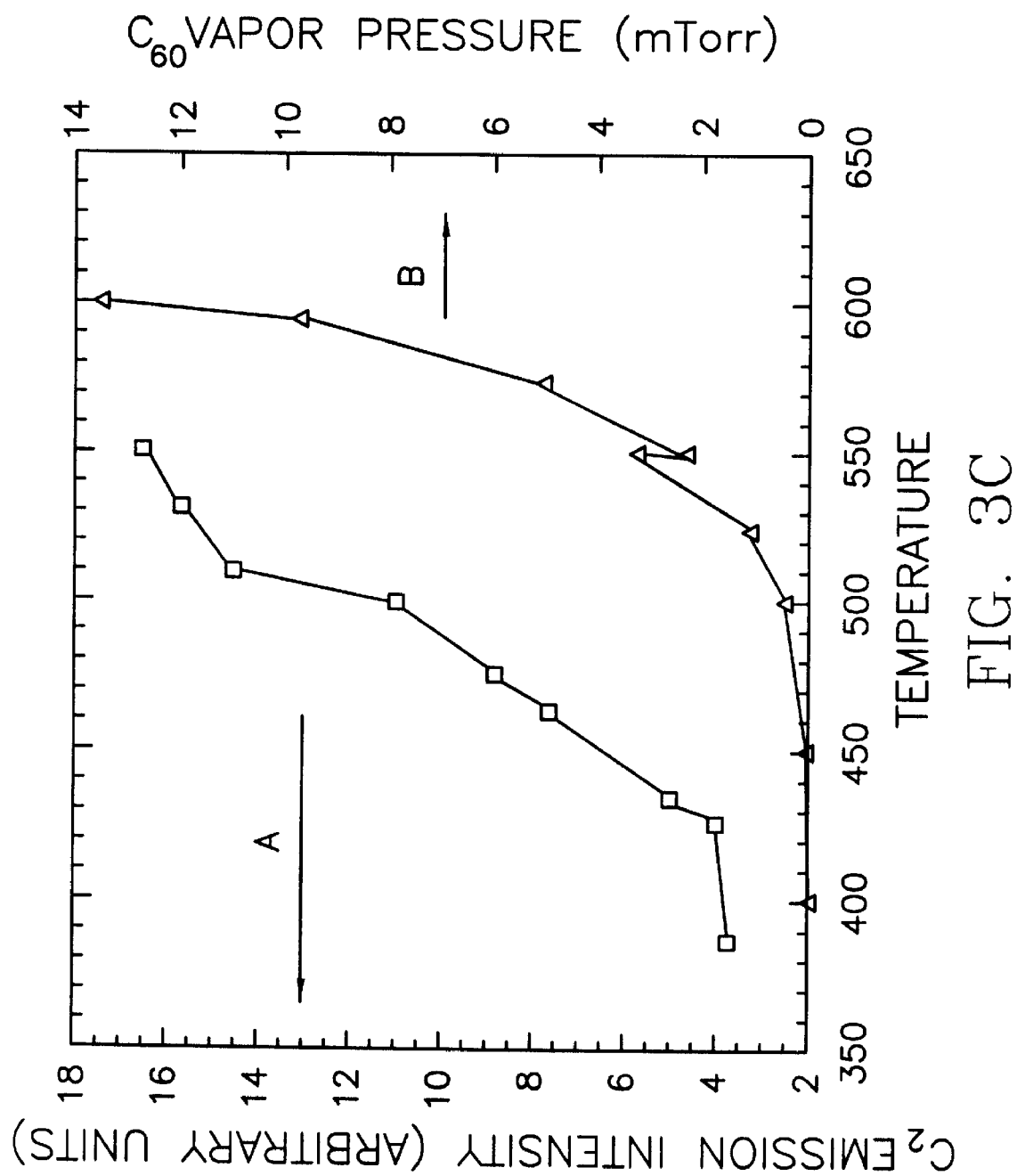
FIG. 3C shows $C_{60}$ vapor pressure and integrated intensity of the $\Delta v=o$ band from $C_2$ emissions.

An examination of the Swan bands in FIG. 3A was performed by analyzing emission spectra as a function of sublimator source temperature. The Swan band emission intensities were found to increase as a function of sublimator temperature (see FIG. 3C). Under saturation conditions of the argon carrier gas, the emission intensities should follow the vapor pressure of $C_{60}$ (see FIG. 3C, curve B). However, a log plot clearly shows that the argon carrier gas is far from being saturated with the equilibrium $C_{60}$ pressure. The $C_2$ concentration in the plasma increases with temperature due to increased $C_{60}$ volatility which shows the $C_2$ emission is not a minor constituent, nor is it due to carbon particles transported into the plasma. Continuation of this method of manufacture for a period of time (several hours or more) at sublimator temperatures of 550° C. results in depletion of $C_{60}$ and higher fullerenes, as evidenced by decreasing Swan band intensities in the spectra. After such a prolonged time of operation, lowering the temperature to 500° C. results in emission spectra having intensities diminished by a factor of ten compared to those obtained with a fresh batch of soot.

EXAMPLE IV

The same basic method of Example II was followed except the microwave power level was varied from 500 to 1200 watts. There was no noticeable change in the absolute intensity or the intensity ratios of the different Swan band frequencies.

EXAMPLE V

Figure 6A:
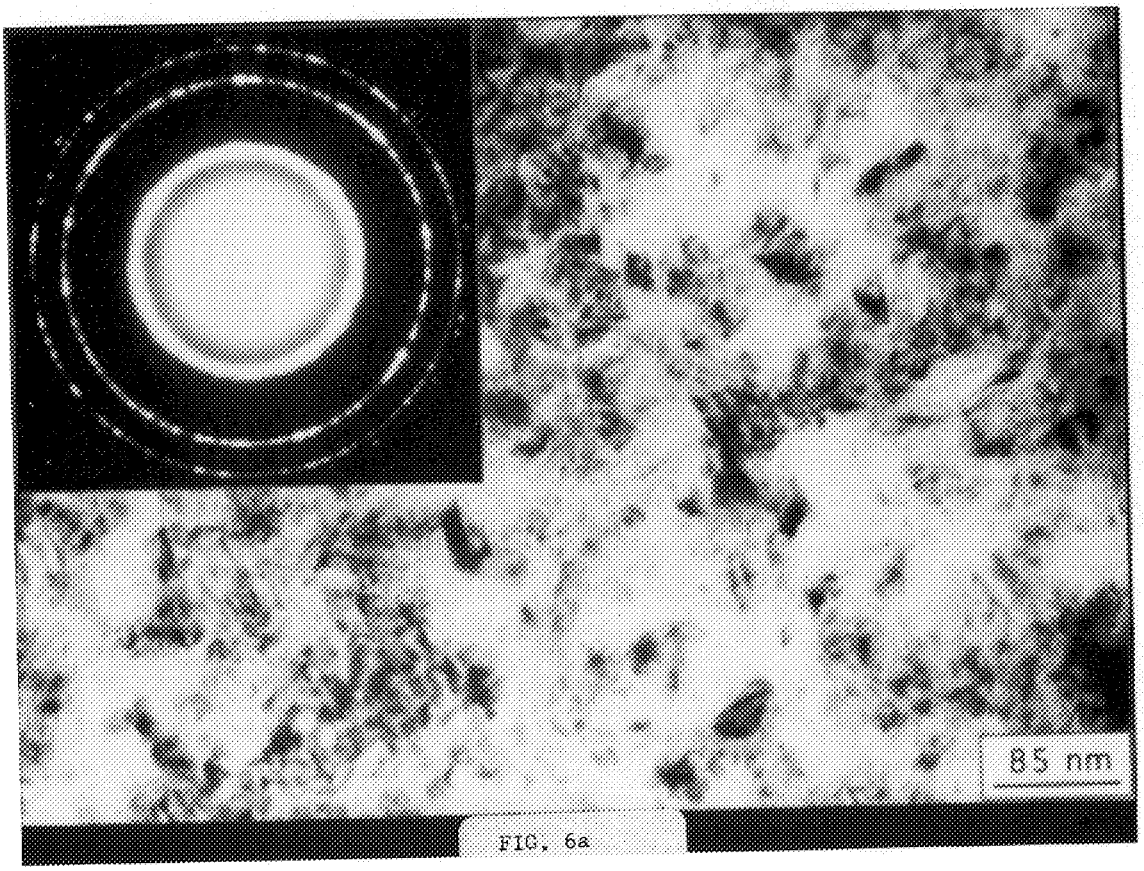
FIG. 6A illustrates a transmission electron microscope (TEM) micrograph from a diamond film of one form of the invention with a selected area electron diffraction pattern inset.
Figure 6B:
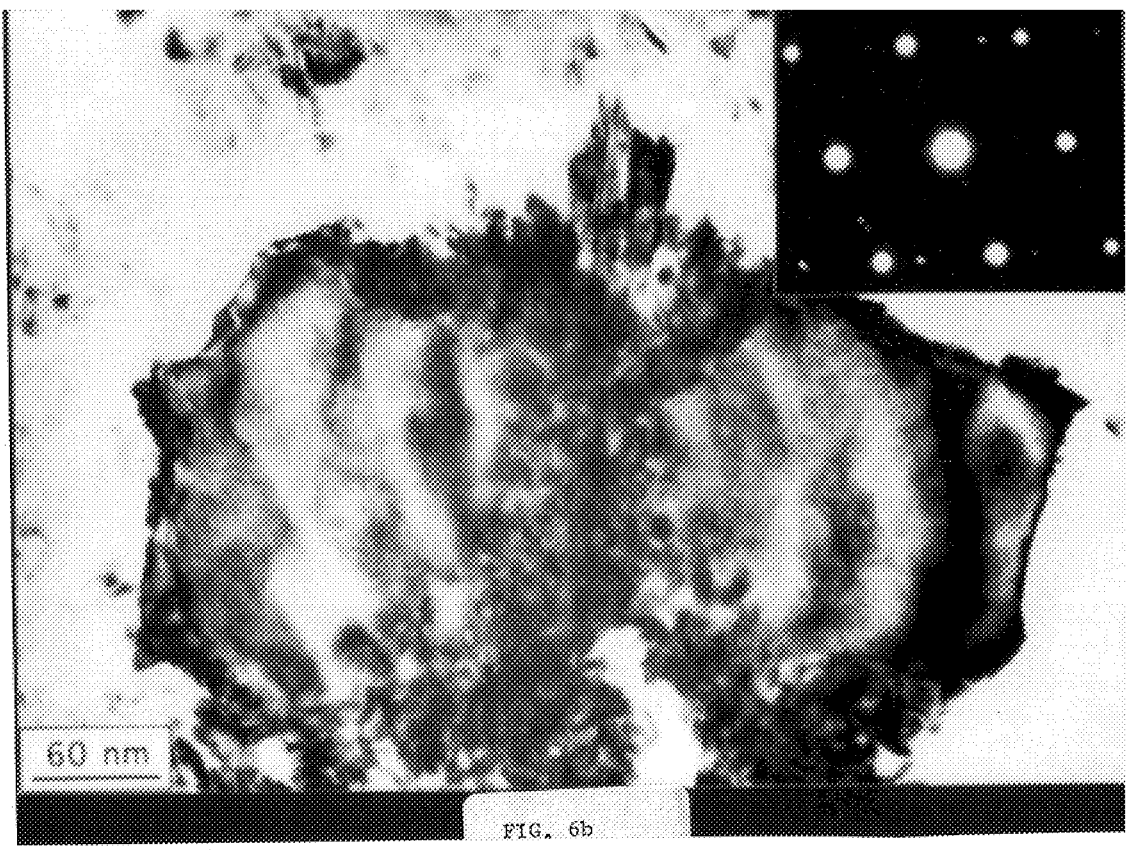
FIG. 6B illustrates a TEM micrograph of two diamond grains from a diamond film of the invention with the grains having a common <111> orientation.

The growth rate of diamond film in Example II was characterized to be about 1.2 microns/hour which is higher than, or comparable to, the deposition rate observed using 1% methane in hydrogen under similar system deposition conditions. Micrographs from both SEM and TEM (see FIG. 6) show much smaller defect density compared to films prepared at 300m Torr with a magnetized plasma using $CH_4$—$H_2$—$O_2$ mixtures as prepared by the applicants herein. The films prepared by the method of the invention also show no evidence of graphite contamination.

EXAMPLE VI

The procedure described in Example I was followed except that the chamber pressure was 50 mTorr, using an Ar flow rate >10 sccm with an upper magnet current of 150A and a lower magnet current of 115A to improve plasma stability. The microwave power was 500 watts, and the fullerene sublimator heater was operated at 110 volts, resulting in a sublimation source temperature of about 500° C. An intense $C_2$-rich green plasma with an optical emission spectrum similar to that of FIG. 3A was obtained.

EXAMPLE VII

In another method, fullerene rich soot is replaced by a flow of $CH_4$ gas as the source of carbon for the diamond. The experimental conditions for the deposition system 10 (except for lack of the soot 12) are set forth in Table 1 for Films D–G. In other experiments acetylene ($C_2H_2$) was also used under similar conditions as $CH_4$ and diamond was produced.

EXAMPLE VIII

Figure 7:
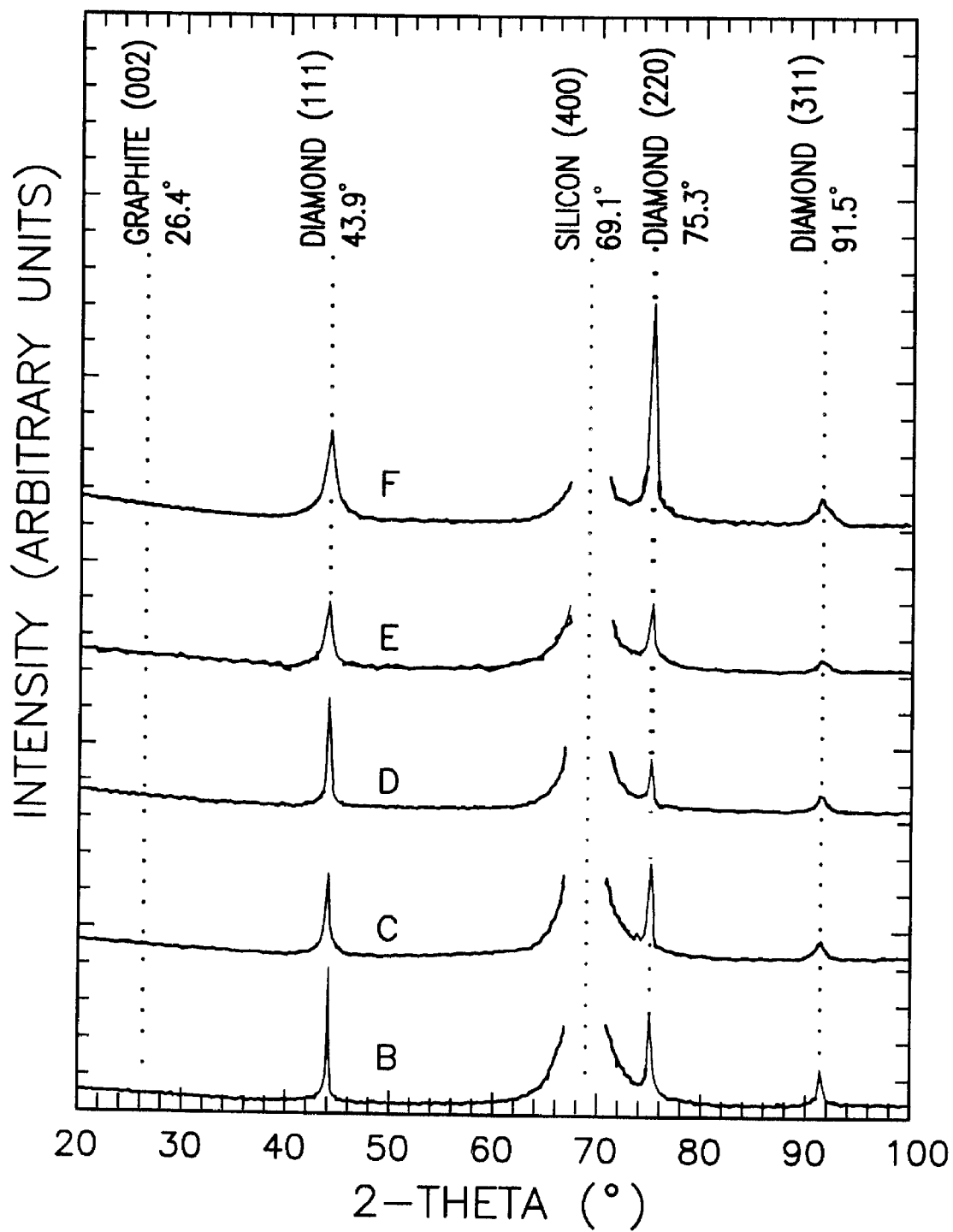
FIG. 7 shows XRD measurements for Films B–F (Table 1) showing diamond as the only crystalline material present in the films; the (400) peak from the silicon substrate has been removed for clarity.

Characterization of the resulting Films A–G are discussed herein. The Films A–G grown or described hereinbefore are characterized as nanocrystalline diamond films. FIG. 7 shows XRD patterns from Films B–F. The characteristic (111), (220) and (311) diamond peaks are evident. The strong Si (400) peak due to the silicon substrate has been removed. There is no evidence of the strong (002) graphite peak at 26.4°. This indicates that the films contain diamond and no appreciable amounts of other crystalline material.

Figure 8:
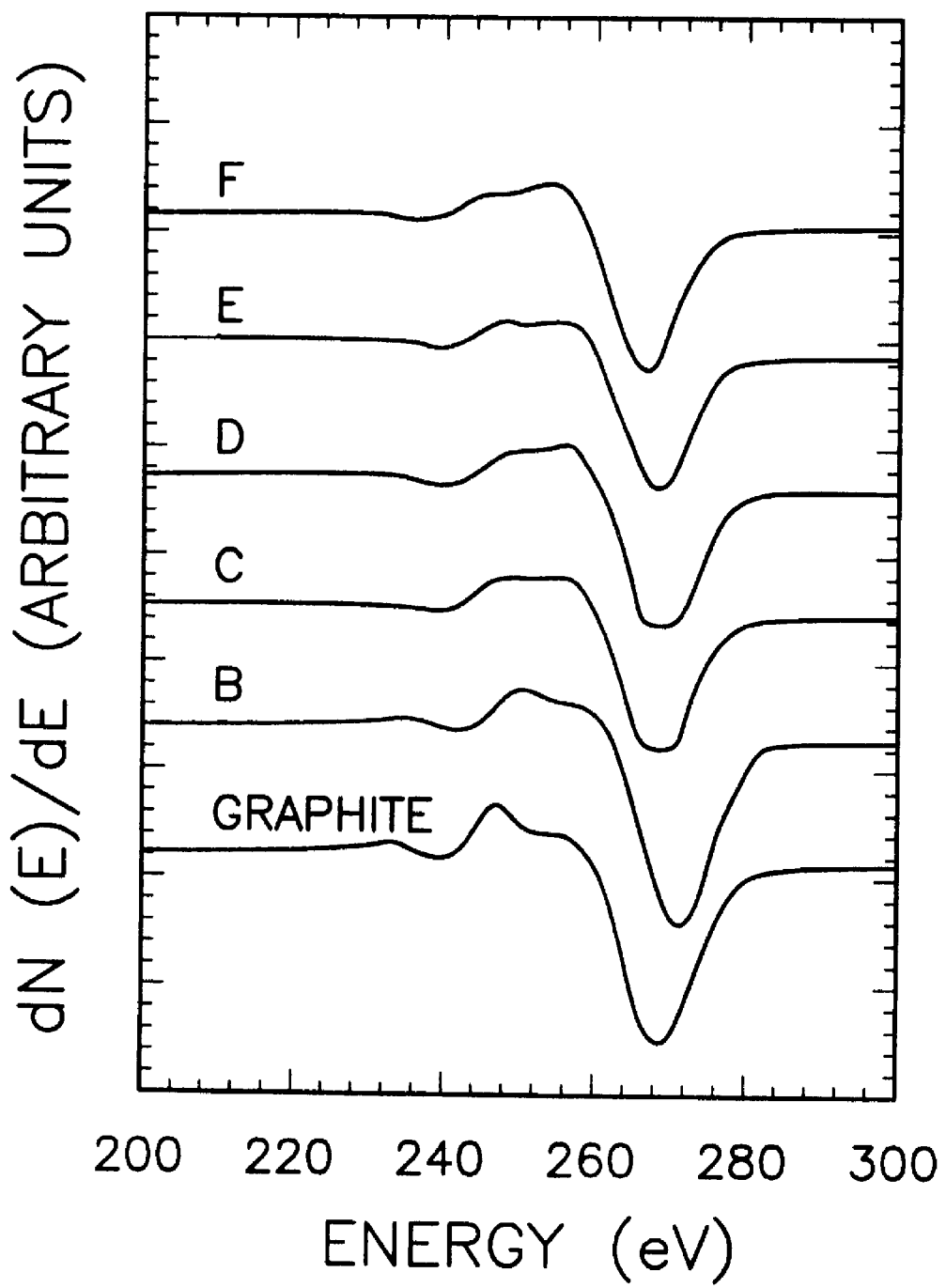
FIG. 8 shows that AES spectra for Films C–F to be very similar to diamond; Film B appears to be a hybrid between diamond and graphite, indicating a higher $sp^2/sp^3$ carbon ratio in this film.

Evidence of low $sp^2/sp^3$ carbon ratios in the films is obtained from AES measurements of the carbon KLL peak shown in FIG. 8. The KLL peak is sensitive to the bonding state of the carbon atom and has been used to determine $sp^2/sp^3$ ratios in a-C:H films. The AES spectra for Films C–F are very similar to that reported in the literature for diamond, indicating a low $sp^2/sp^3$ ratio. The AES spectrum of Film B appears to be somewhere between diamond and graphite, indicating a higher $sp^2/sp^3$ carbon ratio in this film.

Figure 9:
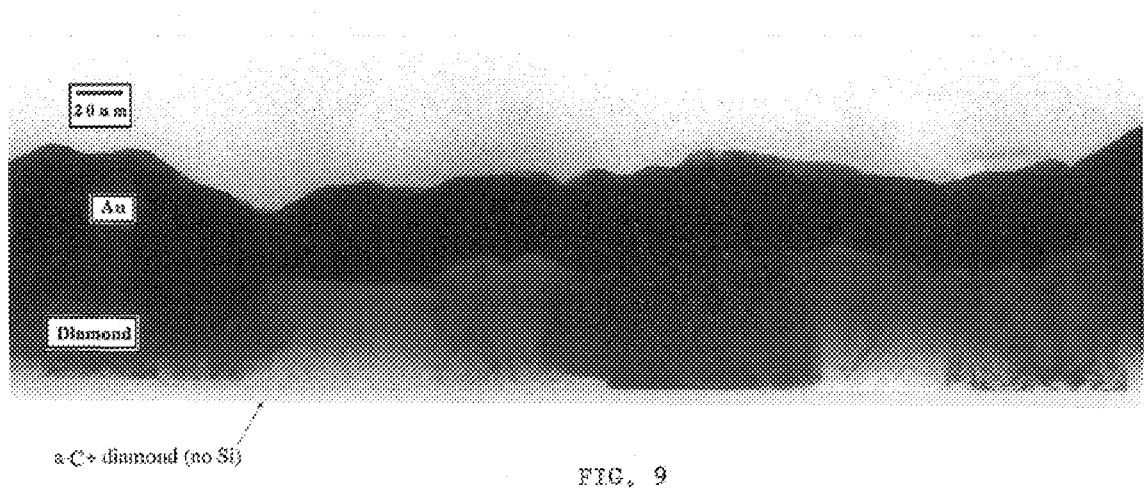
FIG. 9 shows the HRTEM image of Film A; the silicon substrate has been removed and a gold layer deposited on top; an amorphous carbon layer has formed on top of the silicon before diamond growth began; the diamond grain boundaries are sharp, with little evidence of $sp^2$ carbon; a continuous diamond film was formed at a thickness of 20–30 nm compared to 500–1000 nm required for conventional methods.

High resolution TEM has been used to examine the microstructure of films grown with fullerene precursors and indicates the films are composed of small diamond grains (20 nm–300 nm) with relatively clean grain boundaries. FIG. 9 shows a HRTEM image of a section of Film A. The silicon substrate has been removed and a layer of gold deposited on the diamond. A 100 Å thick layer composed of amorphous carbon and diamond was immediately above the silicon substrate and formed preceding diamond film growth. The diamond grains are clearly visible above the amorphous layer and appear as well ordered diamond crystals. The boundaries between the grains are sharp and appear to contain little or no nondiamond phases. This further indicates these films are composed of nanocrystalline diamond films with little $sp^2$ carbon present.

Figure 10:
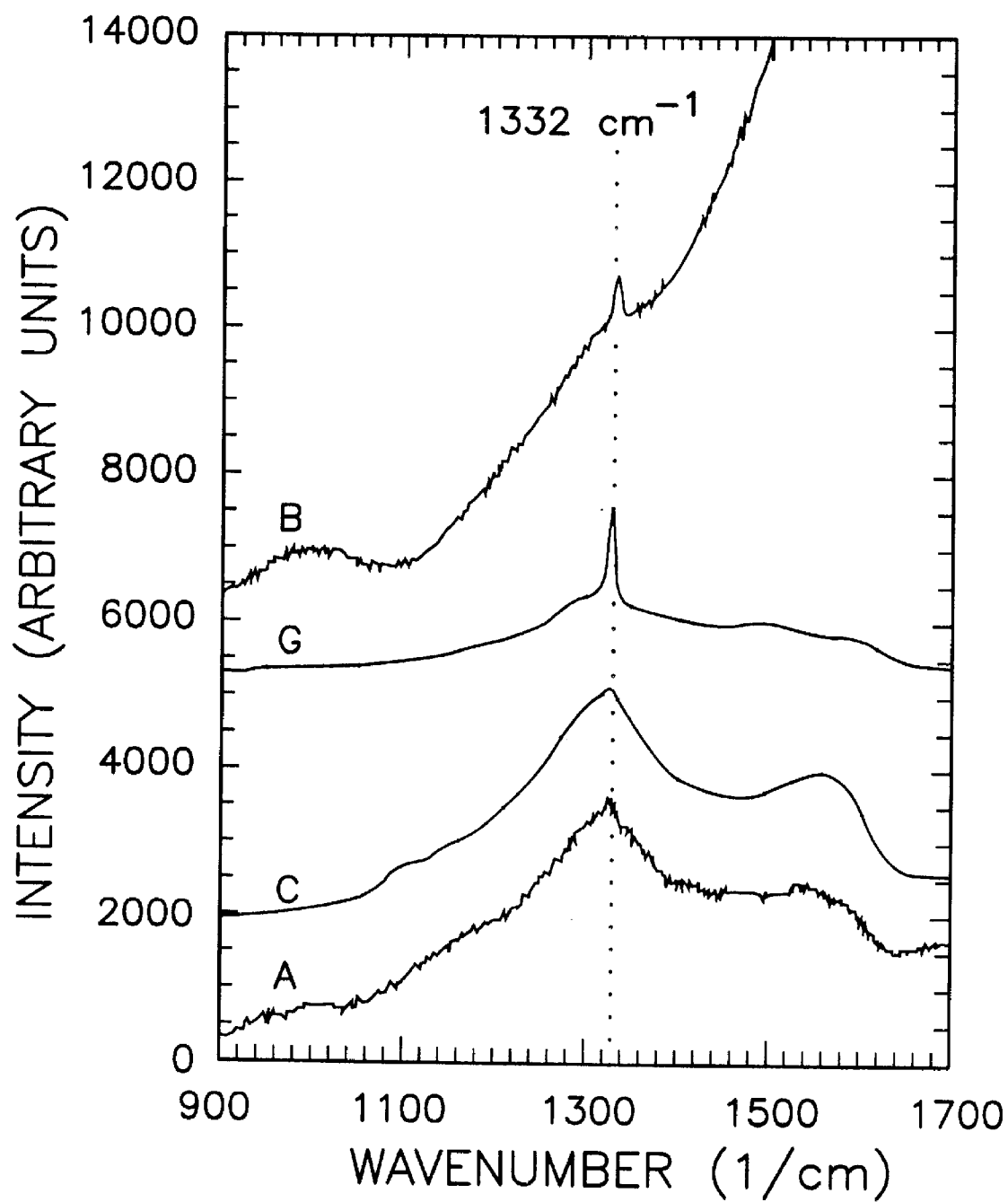
FIG. 10 shows Raman spectra of the films with a diamond peak at 1332 $cm^{-1}$, as well as features at 1580 and 1320 $cm^{-1}$ which are attributed to $sp^2$ carbon. Films A and C show an additional feature at 1140 $cm^{-1}$ which has been attributed to nanocrystalline diamond.

Raman spectra of Films A–C and G are shown in FIG. 10 which are representative of all the films grown. Raman spectra of Films E and F are similar to Film C while the Raman spectrum of Film D is similar to Film B. The Raman spectra show a peak at 1332 $cm^{-1}$ attributed to diamond. Features at 1580 and 1330 $cm^{-1}$ have been attributed to $sp^2$ carbon. An additional feature around 1140 $cm^{-1}$ appears for Films A and C which has been attributed to nanocrystalline diamond. For Film B, an intense fluorescence peak at 2250 $cm^{-1}$ (1.68 eV) results in the rapidly rising background. The weak 1332 $cm^{-1}$ peak relative to other Raman features for films grown at low hydrogen contents (Films A and C) is attributed to the small grain size in the films rather than an increase in the $sp^2/sp^3$ carbon ratio. The 1332 $cm^{-1}$ peak intensity has been shown to decrease with decreasing grain size for both diamond films, where the grain size was determined from XRD measurements, and for diamond particles of known size. Furthermore, these Raman spectra were excited using 632.8 nm light, which is more sensitive to the nondiamond carbon phases than the 488 nm Argon ion laser light commonly employed for measuring Raman spectra. The present interpretation is supported by the TEM images, which indicate that Film A is nanocrystalline, as well as the AES and XRD data, which indicate the $sp^2/sp^3$ ratios of the films are similar to diamond and the only crystalline component in the films are diamond.

AFM measurements (see Table 1) of rms surface roughness for Films A–E and G, all grown to ≈2 $\mu$m, shows that higher carbon to hydrogen ratios lead to smooth film growth, while lower ratios lead to rougher films. Film F demonstrates that in these low hydrogen content plasmas, a 10 $\mu$m thick, smooth (rms roughnesses of 45 nm) film can be grown.

Figure 11A:
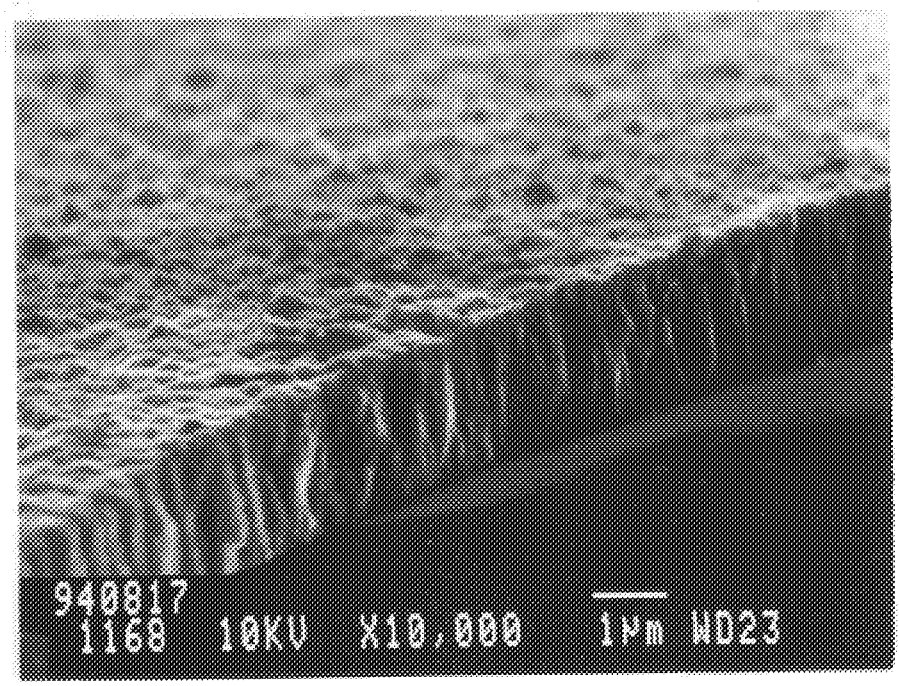
FIG. 11 shows SEM micrographs of Film A (a) before tribological testing and (B) the wear track after tribological testing.
Figure 11B:
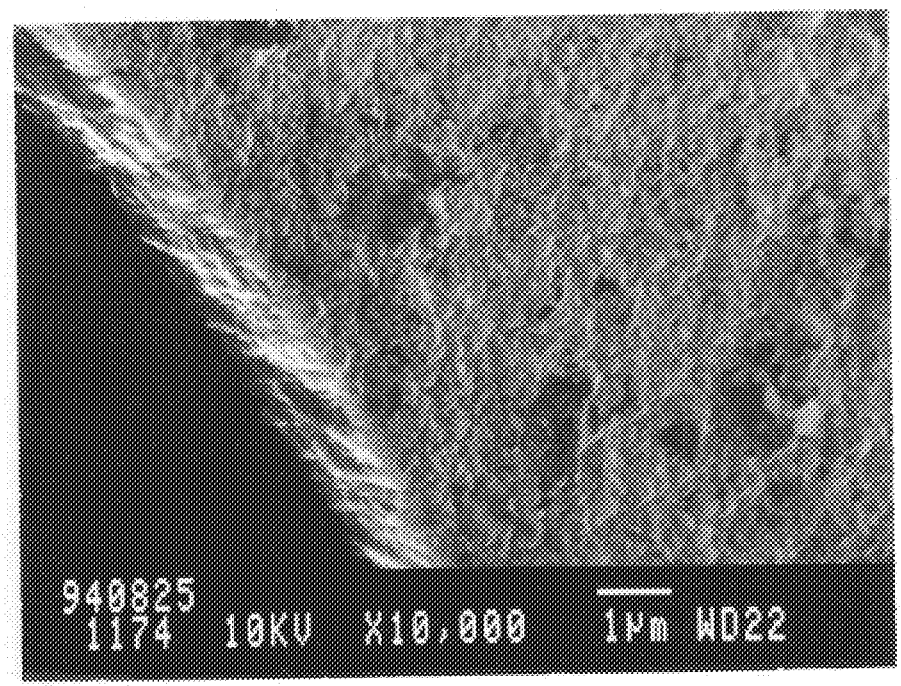

FIG. 11A is a cross-sectional SEM micrograph of Film A. As is clear, the surface of this nanocrystalline diamond Film is rather smooth. FIG. 11B shows that the wear track formed on Film A during tribological testing becomes extremely smooth.

Figure 12:
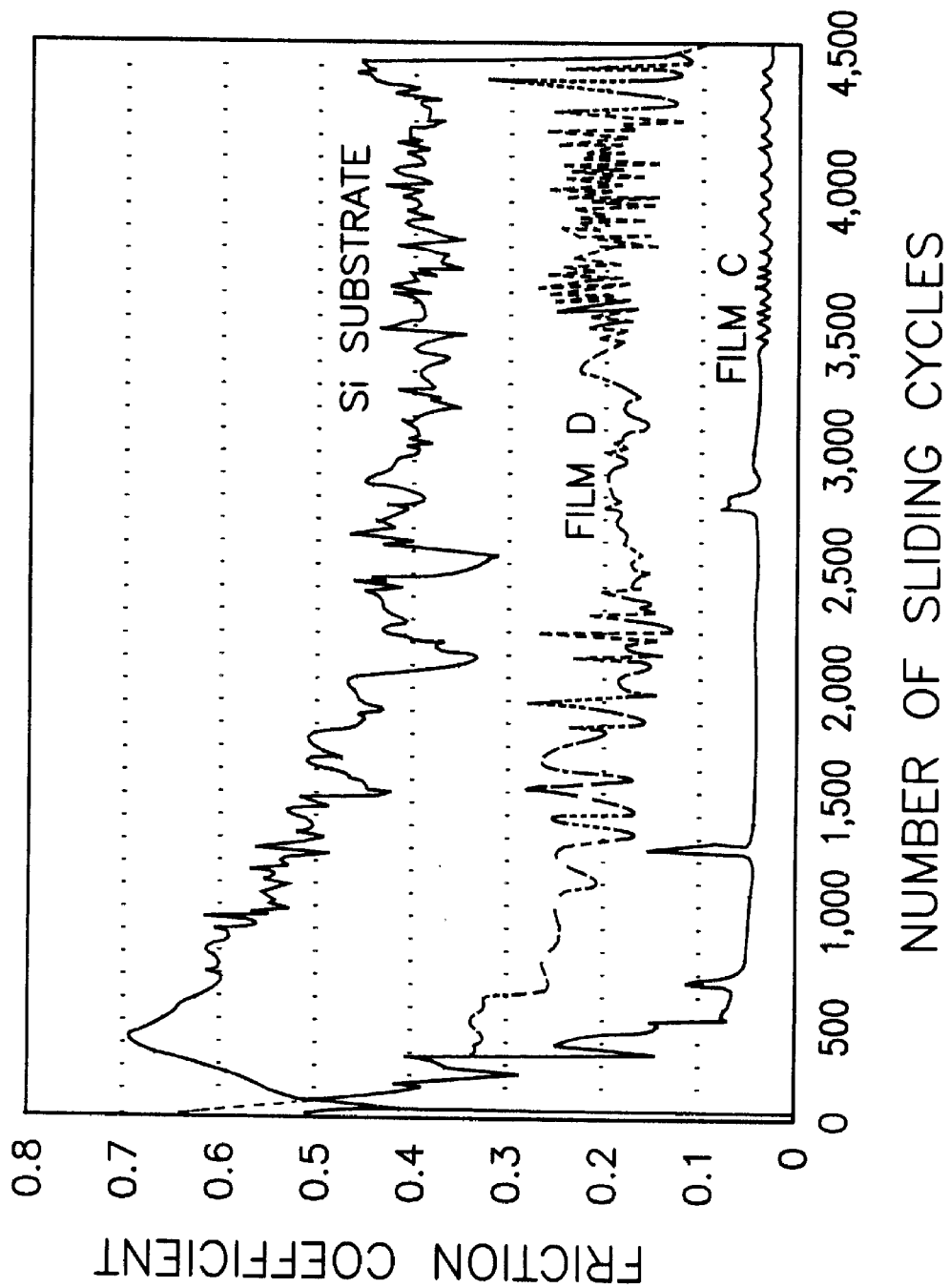
FIG. 12 shows the variation of the friction coefficients of Films C, D and an uncoated silicon substrate during sliding against $Si_3N_4$ balls in dry $N_2$ under a 2N load; Film C achieves a friction coefficient comparable to cleaned single crystal national diamond.

As is evident from FIG. 12, Film D with a rough surface finish exhibits a significantly higher friction coefficient than the smooth Film C in dry $N_2$. As a reference, the friction coefficient of the Si substrate against the $Si_3N_4$ ball is also included in this FIG. 12. The initial friction coefficient of rough diamond film is particularly high, i.e., =0.65. Furthermore, the friction trace of this film is rather unstable and fluctuates between 0.15 and 0.27 at steady-state (see FIG. 12). Table 1 shows the overall frictional performance and ball wear rate for both the rough and smooth diamond films. Again, the highest friction coefficients are due to rough diamond films, whereas the smooth diamond films exhibit friction coefficients of 0.04 to 0.08. We believe that the large fluctuations in the friction traces and very high initial friction coefficients of rough diamond films are largely due to ploughing and interlocking of asperities across the sliding interface. Sharp asperity tips of diamond crystals can dig in and cut the surface of softer counterface material, thus causing severe abrasion and ploughing. It is known that a high degree of ploughing can cause high frictional traction between sliding surfaces. This in turn promotes high friction and severe abrasion of the much softer counterface material. During successive sliding passes, the sharp asperity tips are progressively rounded and eventually blunted to result in a much smoother surface finish. Furthermore, the valleys between asperities are filled with a blanket of wear debris particles. The combination of these two physical phenomena produces a relatively smooth surface finish and eventually results in somewhat lower friction coefficients, i.e., 0.2 on rough diamond films as shown in FIG. 12. This observation is consistent with conventional results which show very high friction coefficients for rough diamond films. In general, prior art found that the greater the surface roughness, the higher the initial and steady-state friction coefficients for diamond films.

Owing to their much smoother surface finish, Films A and C exhibit very low friction coefficients, i.e., 0.04 to 0.05, especially at steady-state (see FIG. 12). These values are comparable to that of a natural diamond in dry $N_2$ as conventionally reported. As shown in FIG. 11A, the surface asperities of these films are not faceted and sharp. Most importantly, the sliding contact surfaces of these films become exceedingly smooth under the influence of repeated sliding (see FIG. 11B). As a result, the extent of frictional losses during sliding against $Si_3N_4$ remain low, especially after a break-in regime of the sliding tests. In short, these films cause much lower ploughing, hence very little fluctuation in friction traces during sliding.

Table 1 lists the wear rates of $Si_3N_4$ balls during sliding against various diamond films. As is evident, compared to smooth diamond films, rough diamond films cause much higher wear losses on counterface balls. This can be attributed to severe abrasion caused by the sharp asperity tips and edges of rough diamond crystals, whereas the smooth films result in much lower wear losses on the $Si_3N_4$ ball.

While preferred embodiments of the invention have been shown and described, it will be clear to those skilled in the art that various changes and modifications can be made without departing from the invention in its broader aspects as set forth in the claims provided hereinafter.

What is claimed is:

1. A method for manufacturing a diamond film on a substrate, comprising the steps of:
   (a) forming a carbonaceous vapor selected from the group consisting of a fullerene: fragments thereof; and a hydrocarbon;
   (b) providing a gas stream consisting essentially of argon and hydrogen and combining said carbonaceous vapor with said gas stream;
   (c) passing said combined carbonaceous vapor and gas stream into a chamber;
   (d) forming a plasma in said chamber; and
   (e) depositing said already fragmented carbon dimer species onto said substrate to form said diamond film.

2. The method as defined in claim 1 wherein said step (a) comprises heating a fullerene containing solid to form said carbonaceous vapor.

3. The method as defined in claim 2 wherein said heating step comprises heating said fullerene containing solid to a temperature of at least about 500° C.

4. The method as defined in claim 1 wherein said step (b) comprises entraining said fullerene vapor in said gas stream.

5. The method as defined in claim 4 wherein the carbonaceous vapor is selected from the group consisting of $CH_4$ and $C_2H_2$.

6. The method as defined in claim 1 wherein said step (d) comprises establishing a microwave field within said chamber.

7. The method as defined in claim 1 wherein said substrate comprises a silicon substrate.

8. The method as defined in claim 1 wherein said hydrogen comprises about 2–19% by volume of the gas stream.

9. A system for manufacturing a diamond film on a substrate, comprising:
   a source for providing a carbonaceous vapor;
   means for providing an argon and hydrogen gas stream and combining said carbonaceous vapor with said gas stream to form a combined gas atmosphere;
   a chamber for receiving said combined carbonaceous vapor and noble gas stream; and
   a microwave energy source for producing a microwave field within said chamber, the microwave field causing formation of a plasma containing excited carbonaceous species and excited gas stream, thereby resulting in accumulation of said diamond film on said substrate.

10. The system as defined in claim 9 wherein said substrate consists essentially of a single crystal of silicon.

11. The system as defined in claim 9 further including a graphite stage including means for heating to control temperature of said substrate.

* * * * *